United States Patent
Sasada

(10) Patent No.: US 12,532,414 B2
(45) Date of Patent: Jan. 20, 2026

(54) LIQUID CRYSTAL POLYMER FILM, POLYMER FILM, AND LAMINATE

(71) Applicant: FUJIFILM Corporation, Tokyo (JP)

(72) Inventor: Yasuyuki Sasada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 302 days.

(21) Appl. No.: 18/318,705

(22) Filed: May 16, 2023

(65) Prior Publication Data
US 2023/0292434 A1   Sep. 14, 2023

Related U.S. Application Data

(63) Continuation of application No. PCT/JP2021/042876, filed on Nov. 24, 2021.

(30) Foreign Application Priority Data

Nov. 24, 2020 (JP) ................... 2020-194655
Nov. 19, 2021 (JP) ................... 2021-188867

(51) Int. Cl.
*H05K 1/03* (2006.01)
*C08L 67/04* (2006.01)
*C08L 77/12* (2006.01)

(52) U.S. Cl.
CPC ............ *H05K 1/0373* (2013.01); *C08L 67/04* (2013.01); *C08L 77/12* (2013.01); *C08L 2203/16* (2013.01); *C08L 2205/12* (2013.01); *H05K 2201/0141* (2013.01)

(58) Field of Classification Search
None
See application file for complete search history.

(56) References Cited

U.S. PATENT DOCUMENTS

| | | | | |
|---|---|---|---|---|
| 5,719,354 | A * | 2/1998 | Jester | H05K 3/4617 361/792 |
| 5,962,122 | A * | 10/1999 | Walpita | C08K 3/22 524/451 |
| 6,605,324 | B1 * | 8/2003 | Machida | B29C 55/023 264/467 |
| 2002/0076538 | A1 * | 6/2002 | St. Lawrence | B32B 15/085 428/209 |
| 2006/0177640 | A1 * | 8/2006 | Higashioji | B32B 3/12 428/216 |
| 2010/0028623 | A1 * | 2/2010 | Ito | H05K 1/056 428/215 |
| 2012/0231217 | A1 | 9/2012 | Sasada et al. | |
| 2019/0078022 | A1 | 3/2019 | Lee | |

FOREIGN PATENT DOCUMENTS

| | | | | |
|---|---|---|---|---|
| JP | 2004083681 | | 3/2004 | |
| JP | 2004083681 | A * | 3/2004 | ............ B32B 27/26 |
| JP | 2005105165 | | 4/2005 | |
| JP | 2005105165 | A * | 4/2005 | ............ B32B 15/04 |
| JP | 2012198529 | | 10/2012 | |
| JP | 2014237769 | A * | 12/2014 | ............... C08J 7/00 |
| JP | 2015074157 | | 4/2015 | |
| JP | 2015074157 | A * | 4/2015 | ............ B32B 27/34 |
| JP | 2016062954 | | 4/2016 | |
| JP | 2016062954 | A * | 4/2016 | ............ B32B 27/18 |
| JP | 2016117281 | | 6/2016 | |
| JP | 2016117281 | A * | 6/2016 | ............ B32B 37/24 |
| JP | 2019052288 | | 4/2019 | |
| WO | 2004060656 | | 7/2004 | |

OTHER PUBLICATIONS

Sugimasa—JP 2004-083681 A—PCT D4—J-PlatPat Desc—LCP film & board—2004 (Year: 2004).*
Sunamoto—JP 2005-105165 A—PCT D5—MT—LCP film 2005 (Year: 2005).*
Eda—JP 2014-237769 A—MT—LCP film—motivation for filler—2014 (Year: 2014).*
Niwata—JP 2015-074157 A—PCT D2—MT—polyimide-LCP film—2015 (Year: 2015).*
Fukutake—JP 2016-062954 A—PCT D6—MT—laminate for board—filler in LCP+motivation—2016 (Year: 2016).*
Ito—JP 2016-117281 A—PCT D3—MT—three layer film—2016 (Year: 2016).*
Engineering Toolbox—Linear Thermal Expansion Coefficients of Materials—accessed Jun. 7, 2025 (Year: 2025).*
Omnexus—Dissipation Factor (DF) of Plastics—Unit, Formula and Measurement—accessed Jun. 5, 2025 (Year: 2025).*
"International Search Report (Form PCT/ISA/210) of PCT/JP2021/042876", mailed on Feb. 1, 2022, with English translation thereof, pp. 1-7.
"Written Opinion of the International Searching Authority (Form PCT/ISA/237) of PCT/ JP2021/042876", mailed on Feb. 1, 2022, with English translation thereof, pp. 1-14.
"Notice of Reasons for Refusal of Japan Counterpart Application", issued on Nov. 11, 2025, with English translation thereof, p. 1-p. 17.

* cited by examiner

*Primary Examiner* — John Vincent Lawler
(74) *Attorney, Agent, or Firm* — JCIPRNET

(57) ABSTRACT

Provided are a liquid crystal polymer film or a polymer film, which has low linear expansion coefficient and has excellent adhesiveness with a metal layer. The liquid crystal polymer film includes a layer A and a layer B on at least one surface of the layer A, in which the layer A contains a liquid crystal polymer and a linear expansion coefficient of the liquid crystal polymer film is −20 ppm/K to 50 ppm/K.

15 Claims, No Drawings

LIQUID CRYSTAL POLYMER FILM, POLYMER FILM, AND LAMINATE

CROSS-REFERENCE TO RELATED APPLICATIONS

This application is a continuation application of International Application No. PCT/JP2021/042876, filed Nov. 24, 2021, the disclosure of which is incorporated herein by reference in its entirety. Further, this application claims priority from Japanese Patent Application No. 2020-194655, filed Nov. 24, 2020, and Japanese Patent Application No. 2021-188867, filed Nov. 19, 2021, the disclosures of which are incorporated herein by reference in their entireties.

BACKGROUND OF THE INVENTION

1. Field of the Invention

The present disclosure relates to a liquid crystal polymer film, a polymer film, and a laminate.

2. Description of the Related Art

In recent years, frequencies used in a communication equipment tend to be extremely high. In order to suppress transmission loss in a high frequency band, insulating materials used in a circuit board are required to have a lowered relative permittivity and a lowered dielectric loss tangent.

In the related art, polyimide is commonly used as the insulating material used in the circuit board, a liquid crystal polymer which has high heat resistance and low water absorption and is small in loss in the high frequency band has been attracted.

As the liquid crystal polymer in the related art, for example, JP2019-52288A discloses a liquid crystal polymer composition containing a solvent, a soluble liquid crystal polymer dissolved in the solvent, and an additive which contains at least one organic polymer or inorganic filler and is dispersed or dissolved in the solvent.

In addition, as an optical film in the related art, a film disclosed in JP2012-198529A is known.

JP2012-198529A discloses an optical film containing cellulose ester, in which an amount of additives in a surface is controlled by forming the film in multiple layers.

SUMMARY OF THE INVENTION

An object to be achieved by an aspect of the present invention is to provide a liquid crystal polymer film or a polymer film, which has low linear expansion coefficient and has excellent adhesiveness with a substrate.

An object to be achieved by another aspect of the present invention is to provide a laminate using the above-described liquid crystal polymer film or polymer film.

The methods for achieving the above-described objects include the following aspects.

<1> A liquid crystal polymer film comprising:
a layer A; and
a layer B on at least one surface of the layer A,
in which the layer A contains a liquid crystal polymer, and a linear expansion coefficient of the liquid crystal polymer film is −20 ppm/K to 50 ppm/K.

<2> The liquid crystal polymer film according to <1>,
in which a linear expansion coefficient of the layer A is −20 ppm/K to 50 ppm/K.

<3> The liquid crystal polymer film according to <1> or <2>,
in which the liquid crystal polymer has a constitutional unit represented by any of Formulae (1) to (3), $$—O—Ar^1—CO— \qquad \text{Formula (1)}$$

$$—CO—Ar^2—CO— \qquad \text{Formula (2)}$$

$$—X—Ar^3—Y— \qquad \text{Formula (3)}$$

in Formulae (1) to (3), $Ar^1$ represents a phenylene group, a naphthylene group, or a biphenylylene group, $Ar^2$ and $Ar^3$ each independently represent a phenylene group, a naphthylene group, a biphenylylene group, or a group represented by Formula (4), X and Y each independently represent an oxygen atom or an imino group, and hydrogen atoms in $Ar^1$ to $Ar^3$ may be each independently substituted with a halogen atom, an alkyl group, or an aryl group, $$—Ar^4—Z—Ar^5— \qquad \text{Formula (4)}$$

in Formula (4), $Ar^4$ and $Ar^5$ each independently represent a phenylene group or a naphthylene group, and Z represents an oxygen atom, a sulfur atom, a carbonyl group, a sulfonyl group, or an alkylene group.

<4> The liquid crystal polymer film according to any one of <1> to <3>,
in which a dielectric loss tangent of the liquid crystal polymer film is 0.01 or less.

<5> The liquid crystal polymer film according to any one of <1> to <4>,
in which a dielectric loss tangent of the layer A is 0.005 or less.

<6> The liquid crystal polymer film according to any one of <1> to <5>,
in which the liquid crystal polymer film contains a filler in at least one layer of the layer A or the layer B.

<7> The liquid crystal polymer film according to any one of <1> to <6>,
in which the layer A contains a filler.

<8> The liquid crystal polymer film according to <6> or <7>,
in which a number density of the filler is higher inside the liquid crystal polymer film than on a surface of the liquid crystal polymer film.

<9> The liquid crystal polymer film according to any one of <1> to <8>,
in which a dielectric loss tangent of the layer B is 0.02 or less.

<10> The liquid crystal polymer film according to any one of <1> to <9>,
in which the layer B contains a liquid crystal polymer.

<11> The liquid crystal polymer film according to any one of <1> to <10>, further comprising:
a layer C,
in which the layer B, the layer A, and the layer C are provided in this order.

<12> The liquid crystal polymer film according to <11>,
in which a dielectric loss tangent of the layer C is 0.02 or less.

<13> The liquid crystal polymer film according to <11> or <12>,
in which the layer C contains a liquid crystal polymer.

<14> The liquid crystal polymer film according to any one of <11> to <13>,
in which the layer C contains a filler.

<15> The liquid crystal polymer film according to <10> or <13>,
  in which the liquid crystal polymer contained in the layer B or the layer C has a constitutional unit represented by any of Formulae (1) to (3),

  —O—Ar$^1$—CO—   Formula (1)

  —CO—Ar$^2$—CO—   Formula (2)

  —X—Ar$^3$—Y—   Formula (3)

in Formulae (1) to (3), Ar$^1$ represents a phenylene group, a naphthylene group, or a biphenylylene group, Ar$^2$ and Ar$^3$ each independently represent a phenylene group, a naphthylene group, a biphenylylene group, or a group represented by Formula (4), X and Y each independently represent an oxygen atom or an imino group, and hydrogen atoms in Ar$^1$ to Ar$^3$ may be each independently substituted with a halogen atom, an alkyl group, or an aryl group,

  —Ar$^4$—Z—Ar$^5$—   Formula (4)

in Formula (4), Ar$^4$ and Ar$^5$ each independently represent a phenylene group or a naphthylene group, and Z represents an oxygen atom, a sulfur atom, a carbonyl group, a sulfonyl group, or an alkylene group.
<16> A polymer film comprising:
  a layer A; and
  a layer B on at least one surface of the layer A,
  in which the layer A contains a polymer having a dielectric loss tangent of 0.01 or less, and
  a linear expansion coefficient of the polymer film is −20 ppm/K to 50 ppm/K.
<17> A polymer film comprising:
  a layer A; and
  a layer B on at least one surface of the layer A,
  in which the layer A contains at least one polymer selected from the group consisting of a fluorine-based polymer, a polymerized substance of a compound which has a cyclic aliphatic hydrocarbon group and a group having an ethylenically unsaturated bond, a polyphenylene ether, and an aromatic polyether ketone, and
  a linear expansion coefficient of the polymer film is −20 ppm/K to 50 ppm/K.
<18> A laminate comprising:
  the liquid crystal polymer film according to any one of <1> to <15> or the polymer film according to <16> or <17>; and
  a metal layer disposed on a surface of the layer B side in the liquid crystal polymer film or the polymer film.
<19> The laminate according to <18>,
  in which the metal layer is a copper layer disposed on the surface of the layer B, and a peel strength between the layer B and the copper layer is 0.5 kN/m or more.
<20> A laminate comprising:
  the liquid crystal polymer film according to any one of <11> to <14>;
  a metal layer disposed on a surface of the layer B side in the liquid crystal polymer film; and
  a metal layer disposed on a surface of the layer C side in the liquid crystal polymer film.
<21> The laminate according to <20>,
  in which the metal layer disposed on the surface of the layer C side is a copper layer disposed on the surface of the layer C, and
  a peel strength between the layer C and the copper layer disposed on the surface of the layer C is 0.5 kN/m or more.

According to the aspect of the present invention, it is possible to provide a liquid crystal polymer film or a polymer film, which has low linear expansion coefficient and has excellent adhesiveness with a substrate.

Further, according to another aspect of the present invention, it is possible to provide a laminate using the above-described liquid crystal polymer film or polymer film.

DESCRIPTION OF THE PREFERRED EMBODIMENTS

Hereinafter, the contents of the present disclosure will be described in detail. The description of configuration requirements below is made based on representative embodiments of the present disclosure in some cases, but the present disclosure is not limited to such embodiments.

Further, in the present specification, a numerical range shown using "to" indicates a range including numerical values described before and after "to" as a lower limit and an upper limit.

In a numerical range described in a stepwise manner in the present disclosure, an upper limit or a lower limit described in one numerical range may be replaced with an upper limit or a lower limit in another numerical range described in a stepwise manner. Further, in a numerical range described in the present disclosure, an upper limit or a lower limit described in the numerical range may be replaced with a value described in an example.

Further, in a case where substitution or unsubstitution is not noted in regard to the notation of a "group" (atomic group) in the present specification, the "group" includes not only a group that does not have a substituent but also a group having a substituent. For example, the concept of an "alkyl group" includes not only an alkyl group that does not have a substituent (unsubstituted alkyl group) but also an alkyl group having a substituent (substituted alkyl group).

In the present specification, the concept of "(meth)acryl" includes both acryl and methacryl, and the concept of "(meth)acryloyl" includes both acryloyl and methacryloyl.

Further, the term "step" in the present specification indicates not only an independent step but also a step which cannot be clearly distinguished from other steps as long as the intended purpose of the step is achieved.

Further, in the present disclosure, "% by mass" has the same definition as that for "% by weight", and "part by mass" has the same definition as that for "part by weight".

Furthermore, in the present disclosure, a combination of two or more preferred embodiments is a more preferred embodiment.

Further, the weight-average molecular weight (Mw) and the number-average molecular weight (Mn) in the present disclosure are molecular weights converted using polystyrene as a standard substance by performing detection with a gel permeation chromatography (GPC) analysis apparatus using TSKgel SuperHM-H (trade name, manufactured by Tosoh Corporation) column, a solvent of pentafluorophenol (PFP) and chloroform at a mass ratio of 1:2, and a differential refractometer, unless otherwise specified.

(Liquid Crystal Polymer Film or Polymer Film)

A first embodiment of the polymer film according to the present disclosure is a polymer film including a layer A and a layer B on at least one surface of the layer A, in which the layer A contains a polymer having a dielectric loss tangent of 0.01 or less, and a linear expansion coefficient of the polymer film is −20 ppm/K to 50 ppm/K.

A second embodiment of the polymer film according to the present disclosure is a polymer film including a layer A and a layer B on at least one surface of the layer A, in which the layer A contains at least one polymer selected from the group consisting of a fluorine-based polymer, a polymerized substance of a compound which has a cyclic aliphatic hydrocarbon group and a group having an ethylenically unsaturated bond, a polyphenylene ether, and an aromatic polyether ketone, and a linear expansion coefficient of the polymer film is −20 ppm/K to 50 ppm/K.

In addition, a third embodiment of the polymer film according to the present disclosure is a liquid crystal polymer film including a layer A and a layer B on at least one surface of the layer A, in which the layer A contains a liquid crystal polymer, and a linear expansion coefficient of the liquid crystal polymer film is −20 ppm/K to 50 ppm/K.

In the present disclosure, the above-described polymer film in which the layer A contains a liquid crystal polymer is also referred to as a liquid crystal polymer film.

In the present specification, the expression "polymer film according to the embodiment of the present disclosure" denotes all the first embodiment, the second embodiment, and the third embodiment described above, unless otherwise specified.

In addition, in the present specification, the expression "liquid crystal polymer film according to the embodiment of the present disclosure" denotes the above-described third embodiment, unless otherwise specified.

Many of the polymer films in the related art have a large linear expansion coefficient, such as the liquid crystal polymer film disclosed in JP2019-52288A. In a case where a filler is added to the polymer film in order to reduce the above-described linear expansion coefficient, adhesiveness with a substrate (for example, a plastic film, a metal foil, or a metal wire) is insufficient.

As a result of intensive research conducted by the present inventor, it has been found that, with the above-described configuration, it is possible to provide a polymer film having low linear expansion coefficient and having excellent adhesiveness with the substrate.

The detailed mechanism for obtaining the above-described effects is not clear, but assumed as follows.

Since the polymer film contains a polymer having a dielectric loss tangent of 0.01 or less, the polymer film contains at least one polymer selected from the group consisting of a fluorine-based polymer, a polymerized substance of a compound which has a cyclic aliphatic hydrocarbon group and a group having an ethylenically unsaturated bond, a polyphenylene ether, and an aromatic polyether ketone, or the polymer film includes at least two layers of a layer A containing a liquid crystal polymer and a layer B on at least one surface of the layer A, in which a linear expansion coefficient of the liquid crystal polymer film is −20 ppm/K to 50 ppm/K, it is presumed that the linear expansion coefficient can be lowered and mechanical strength near the surface is improved, so that adhesiveness with the substrate is excellent.

From the viewpoint of linear expansion coefficient and adhesiveness with the metal layer, it is preferable that the polymer film according to the embodiment of the present disclosure further includes a layer C in addition to the above-described layer A and the above-described layer B, and it is more preferable that the above-described layer B, the above-described layer A, and the layer C are provided in this order.

In addition, in a case where a metal layer is present separately from each of the above-described layers, the above-described layer C is preferably the outermost layer on the side in contact with the metal layer. Here, the metal layer is preferably a copper layer. As the copper layer, a rolled copper foil formed by a rolling method or an electrolytic copper foil formed by an electrolytic method is preferable. In addition, from the viewpoint of further exerting the effects of the present disclosure, the above-described metal layer preferably has a known surface treatment layer (for example, a chemical treatment layer) on the surface of the side in contact with the polymer film to ensure adhesion to the resin.

The metal layer in the laminate according to the embodiment of the present disclosure may be a metal layer having a circuit pattern.

It is also preferable that the metal layer in the laminate according to the embodiment of the present disclosure is processed into, for example, a desired circuit pattern by etching to form a flexible printed circuit board. The etching method is not particularly limited, and a known etching method can be used.

Further, examples of a method for detecting or determining a layer configuration of the polymer film, a thickness of each layer, and the like include the following methods.

First, a cross-sectional sample of the polymer film is cut out by a microtome, and a layer configuration and a thickness of each layer are determined with an optical microscope. In a case where the determination with an optical microscope is difficult, the determination may be obtained by performing morphological observation with a scanning electron microscope (SEM), component analysis with a time-of-flight secondary ion mass spectrometry (TOF-SIMS), or the like.

The linear expansion coefficient of the polymer film according to the embodiment of the present disclosure is −20 ppm/K to 50 ppm/K, preferably −10 ppm/K to 40 ppm/K, more preferably 0 ppm/K to 35 ppm/K, still more preferably 10 ppm/K to 30 ppm/K, and particularly preferably 15 ppm/K to 25 ppm/K.

From the viewpoint of linear expansion coefficient of the polymer film and adhesiveness with the metal layer, a linear expansion coefficient of the layer A in the polymer film according to the embodiment of the present disclosure is preferably −20 ppm/K to 50 ppm/K, more preferably −10 ppm/K to 40 ppm/K, still more preferably 0 ppm/K to 35 ppm/K, particularly preferably 10 ppm/K to 30 ppm/K, and most preferably 15 ppm/K to 25 ppm/K.

The linear expansion coefficient in the present disclosure is measured by the following method.

Using a thermomechanical analyzer (TMA), a tensile load of 1 g was applied to both ends of a measurement sample of the polymer film or each layer, which has a width of 5 mm and a length of 20 mm, and the measurement sample was heated from 25° C. to 200° C. at a rate of 5° C./min. Thereafter, the measurement sample was cooled to 30° C. at a rate of 20° C./min and then heated again at a rate of 5° C./min, and the linear expansion coefficient is calculated from the inclination of TMA curve between 30° C. to 150° C.

In a case where each layer is measured, a measurement sample may be produced by scraping off the layer to be measured with a razor or the like.

As another method, in a case where it is difficult to measure the linear expansion coefficient by the above-described method, the measurement is carried out by the following method.

The film is cut with a microtome to produce a section sample, and the section sample is set in an optical microscope equipped with a heating stage system (HS82, manufactured by METTLER TOLEDO). Subsequently, the section sample was heated from 25° C. to 200° C. at a rate of 5° C./min, cooled to 30° C. at a rate of 20° C./min, and then heated again at a rate of 5° C./min, and a thickness of the polymer film or each layer at 30° C. (ts30) and a thickness of the polymer film or each layer at 150° C. (ts150) are evaluated. Thereafter, a value obtained by dividing the dimensional change by the temperature change ((ts150-ts30)/(150-30)) is calculated to obtain the linear expansion coefficient of the polymer film or each layer.

From the viewpoint of linear expansion coefficient and adhesiveness with the metal layer, a dielectric loss tangent of the polymer film according to the embodiment of the present disclosure is preferably 0.01 or less, more preferably 0.005 or less, still more preferably 0.004 or less, and particularly preferably more than 0 and 0.003 or less.

From the viewpoint of linear expansion coefficient of the polymer film and adhesiveness with the metal layer, a dielectric loss tangent of the layer A in the polymer film according to the embodiment of the present disclosure is preferably 0.02 or less, more preferably 0.01 or less, still more preferably 0.005 or less, and particularly preferably more than 0 and 0.003 or less.

From the viewpoint of linear expansion coefficient and adhesiveness with the metal layer, dielectric loss tangents of the layer B and the layer C in the polymer film according to the embodiment of the present disclosure are each independently preferably 0.02 or less, more preferably 0.01 or less, still more preferably 0.005 or less, particularly preferably 0.001 or less, and most preferably more than 0 and 0.001 or less.

The dielectric loss tangent in the present disclosure is measured by the following method.

A dielectric constant is measured by a resonance perturbation method at a frequency of 10 GHz. A 10 GHz cavity resonator (CP531 manufactured by Kanto Electronics Application & Development Inc.) is connected to a network analyzer ("E8363B" manufactured by Agilent Technology), and a sample (width: 2 mm×length: 80 mm) of the polymer film or each layer is inserted into the cavity resonator, and the dielectric constant and dielectric loss tangent of the polymer film or each layer are measured based on a change in resonance frequency for 96 hours before and after the insertion in an environment of a temperature of 25° C. and a humidity of 60% RH.

In a case where each layer is measured, an unnecessary layer may be scraped off with a razor or the like to prepare an evaluation sample of only the target layer. In addition, in a case where it is difficult to take out the single film because the thickness of the layer is thin, a layer to be measured may be scraped off with a razor or the like, and the obtained powdery sample may be used. In the present disclosure, the measurement of the dielectric loss tangent of the polymer is carried out according to the above-described method of measuring a dielectric loss tangent by identifying or isolating a chemical structure of the polymer constituting each layer and using a powdered sample of the polymer to be measured. The polymer will be described later.

<Layer A>

The polymer film according to the embodiment of the present disclosure includes a layer A and a layer B on at least one surface of the layer A, in which the layer A contains a polymer having a dielectric loss tangent of 0.01 or less, at least one polymer selected from the group consisting of a fluorine-based polymer, a polymerized substance of a compound which has a cyclic aliphatic hydrocarbon group and a group having an ethylenically unsaturated bond, a polyphenylene ether, and an aromatic polyether ketone, or a liquid crystal polymer.

In the first embodiment of the polymer film according to the present disclosure, from the viewpoint of film-forming properties and mechanical strength, the polymer having a dielectric loss tangent of 0.01 or less, which is contained in the layer A, is preferably a liquid crystal polymer having a dielectric loss tangent of 0.01 or less.

In the second embodiment of the polymer film according to the present disclosure, from the viewpoint of dielectric loss tangent, the at least one polymer selected from the group consisting of a fluorine-based polymer, a polymerized substance of a compound which has a cyclic aliphatic hydrocarbon group and a group having an ethylenically unsaturated bond, a polyphenylene ether, and an aromatic polyether ketone, which is contained in the layer A, is preferably a fluorine-based polymer.

—Liquid Crystal Polymer—

In the present disclosure, the type of the liquid crystal polymer is not particularly limited, and a known liquid crystal polymer can be used.

In addition, the liquid crystal polymer may be a thermotropic liquid crystal polymer which exhibits liquid crystallinity in a molten state, or may be a lyotropic liquid crystal polymer which exhibits liquid crystallinity in a solution state. Further, in a case where the liquid crystal polymer is a thermotropic liquid crystal polymer, the liquid crystal polymer is preferably a liquid crystal polymer which is molten at a temperature of 450° C. or lower.

Examples of the liquid crystal polymer include a liquid crystal polyester, a liquid crystal polyester amide in which an amide bond is introduced into the liquid crystal polyester, a liquid crystal polyester ether in which an ether bond is introduced into the liquid crystal polyester, and a liquid crystal polyester carbonate in which a carbonate bond is introduced into the liquid crystal polyester.

In addition, as the liquid crystal polymer, from the viewpoint of liquid crystallinity and linear expansion coefficient, a polymer having an aromatic ring is preferable, and an aromatic polyester or an aromatic polyester amide is more preferable.

Further, the liquid crystal polymer may be a polymer in which an imide bond, a carbodiimide bond, a bond derived from an isocyanate, such as an isocyanurate bond, or the like is further introduced into the aromatic polyester or the aromatic polyester amide.

Further, it is preferable that the liquid crystal polymer is a wholly aromatic liquid crystal polymer formed of only an aromatic compound as a raw material monomer.

Examples of the liquid crystal polymer include the following liquid crystal polymers.

1) a liquid crystal polymer obtained by polycondensing (i) an aromatic hydroxycarboxylic acid, (ii) an aromatic dicarboxylic acid, and (iii) at least one compound selected from the group consisting of an aromatic diol, an aromatic hydroxyamine, and an aromatic diamine;

2) a liquid crystal polymer obtained by polycondensing a plurality of types of aromatic hydroxycarboxylic acids;

3) a liquid crystal polymer obtained by polycondensing (i) an aromatic dicarboxylic acid and (ii) at least one compound selected from the group consisting of an aromatic diol, an aromatic hydroxyamine, and an aromatic diamine;

4) a liquid crystal polymer obtained by polycondensing (i) polyester such as polyethylene terephthalate and (ii) an aromatic hydroxycarboxylic acid.

Here, the aromatic hydroxycarboxylic acid, the aromatic dicarboxylic acid, the aromatic diol, the aromatic hydroxyamine, and the aromatic diamine may be each independently replaced with a polycondensable derivative.

For example, the aromatic hydroxycarboxylic acid and the aromatic dicarboxylic acid can be replaced with aromatic hydroxycarboxylic acid ester and aromatic dicarboxylic acid ester, by converting a carboxy group into an alkoxycarbonyl group or an aryloxycarbonyl group.

The aromatic hydroxycarboxylic acid and the aromatic dicarboxylic acid can be replaced with aromatic hydroxycarboxylic acid halide and aromatic dicarboxylic acid halide, by converting a carboxy group into a haloformyl group.

The aromatic hydroxycarboxylic acid and the aromatic dicarboxylic acid can be replaced with aromatic hydroxycarboxylic acid anhydride and aromatic dicarboxylic acid anhydride, by converting a carboxy group into an acyloxycarbonyl group.

Examples of a polymerizable derivative of a compound having a hydroxy group, such as an aromatic hydroxycarboxylic acid, an aromatic diol, and an aromatic hydroxyamine, include a derivative (acylated product) obtained by acylating a hydroxy group and converting the acylated group into an acyloxy group.

For example, the aromatic hydroxycarboxylic acid, the aromatic diol, and the aromatic hydroxyamine can be each replaced with an acylated product by acylating a hydroxy group and converting the acylated group into an acyloxy group.

Examples of a polymerizable derivative of a compound having an amino group, such as an aromatic hydroxyamine or an aromatic diamine, include a derivative (acylated product) obtained by acylating an amino group and converting the acylated group to an acylamino group.

For example, the aromatic hydroxyamine and the aromatic diamine can be each replaced with an acylated product by acylating an amino group and converting the acylated group into an acylamino group.

From the viewpoint of liquid crystallinity, linear expansion coefficient, and adhesiveness with the metal layer, the liquid crystal polymer preferably has a constitutional unit represented by any of Formulae (1) to (3) (hereinafter, a constitutional unit represented by Formula (1) or the like may be referred to as a constitutional unit (1) or the like), more preferably has a constitutional unit represented by Formula (1), and particularly preferably has a constitutional unit represented by Formula (1), a constitutional unit represented by Formula (2), and a constitutional unit represented by Formula (3).

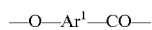  Formula (1)

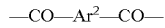  Formula (2)

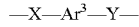  Formula (3)

In Formulae (1) to (3), Ar' represents a phenylene group, a naphthylene group, or a biphenylylene group, Ar² and Ar³ each independently represent a phenylene group, a naphthylene group, a biphenylylene group, or a group represented by Formula (4), X and Y each independently represent an oxygen atom or an imino group, and hydrogen atoms in Ar' to Ar³ may be each independently substituted with a halogen atom, an alkyl group, or an aryl group.

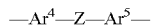  Formula (4)

In Formula (4), $Ar^4$ and $Ar^5$ each independently represent a phenylene group or a naphthylene group, and Z represents an oxygen atom, a sulfur atom, a carbonyl group, a sulfonyl group, or an alkylene group.

Examples of the halogen atom include a fluorine atom, a chlorine atom, a bromine atom, and an iodine atom.

Examples of the alkyl group include a methyl group, an ethyl group, an n-propyl group, an isopropyl group, an n-butyl group, an isobutyl group, an s-butyl group, a t-butyl group, an n-hexyl group, a 2-ethylhexyl group, an n-octyl group, and an n-decyl group. The number of carbon atoms in the alkyl group is preferably 1 to 10.

Examples of the aryl group include a phenyl group, an o-tolyl group, an m-tolyl group, a p-tolyl group, a 1-naphthyl group, and a 2-naphthyl group. The number of carbon atoms in the aryl group is preferably 6 to 20.

In a case where the hydrogen atom is substituted with any of these groups, the number of each of substitutions in $Ar^1$, $Ar^2$, and Ara independently is preferably 2 or less and more preferably 1.

Examples of the alkylene group include a methylene group, a 1,1-ethanediyl group, a 1-methyl-1,1-ethanediyl group, a 1,1-butanediyl group, and a 2-ethyl-1,1-hexanediyl group. The number of carbon atoms in the alkylene group is preferably 1 to 10.

The constitutional unit (1) is a constitutional unit derived from an aromatic hydroxycarboxylic acid.

Preferred examples of the constitutional unit (1) include an aspect in which $Ar^1$ represents a p-phenylene group (constitutional unit derived from p-hydroxybenzoic acid), an aspect in which $Ar^1$ represents a 2,6-naphthylene group (constitutional unit derived from 6-hydroxy-2-naphthoic acid), and an aspect in which Ar' represents a 4,4'-biphenylylene group (constitutional unit derived from 4'-hydroxy-4-biphenylcarboxylic acid).

The constitutional unit (2) is a constitutional unit derived from an aromatic dicarboxylic acid.

Preferred examples of the constitutional unit (2) include an aspect in which $Ar^2$ represents a p-phenylene group (constitutional unit derived from terephthalic acid), an aspect in which $Ar^2$ represents an m-phenylene group (constitutional unit derived from isophthalic acid), an aspect in which $Ar^2$ represents a 2,6-naphthylene group (constitutional unit derived from 2,6-naphthalenedicarboxylic acid), and an aspect in which $Ar^2$ represents a diphenylether-4,4'-diyl group (constitutional unit derived from diphenylether-4,4'-dicarboxylic acid).

The constitutional unit (3) is a constitutional unit derived from an aromatic diol, an aromatic hydroxylamine, or an aromatic diamine.

Preferred examples of the constitutional unit (3) include an aspect in which $Ar^3$ represents a p-phenylene group (constitutional unit derived from hydroquinone, p-aminophenol, or p-phenylenediamine), an aspect in which $Ar^3$ represents an m-phenylene group (constitutional unit derived from isophthalic acid), and an aspect in which $Ar^3$ represents a 4,4'-biphenylylene group (constitutional unit derived from 4,4'-dihydroxybiphenyl, 4-amino-4'-hydroxybiphenyl, or 4,4'-diaminobiphenyl).

A content of the constitutional unit (1) is preferably 30% by mole or more, more preferably 30% to 80% by mole, still more preferably 30% to 60% by mole, and particularly preferably 30% to 40% by mole with respect to the total amount of all constitutional units (a value obtained by dividing the mass of each constitutional unit (also referred to as "monomer unit") constituting the liquid crystal polymer by the formula weight of each constitutional unit to calculate an amount (mole) equivalent to the substance amount of each constitutional unit and adding up the amounts).

The content of the constitutional unit (2) is preferably 35% by mole or less, more preferably 10% by mole to 35% by mole, still more preferably 20% by mole to 35% by mole, and particularly preferably 30% by mole to 35% by mole with respect to the total amount of all constitutional units.

The content of the constitutional unit (3) is preferably 35% by mole or less, more preferably 10% by mole to 35% by mole, still more preferably 20% by mole to 35% by mole, and particularly preferably 30% by mole to 35% by mole with respect to the total amount of all constitutional units.

The heat resistance, the strength, and the rigidity are likely to be improved as the content of the constitutional unit (1) increases, but the solubility in a solvent is likely to be decreased in a case where the content thereof is extremely large.

A proportion of the content of the constitutional unit (2) to the content of the constitutional unit (3) is expressed as [content of constitutional unit (2)]/[content of constitutional unit (3)] (mol/mol), and is preferably 0.9/1 to 1/0.9, more preferably 0.95/1 to 1/0.95, and still more preferably 0.98/1 to 1/0.98.

The liquid crystal polymer may have two or more kinds of each of the constitutional units (1) to (3) independently. In addition, the liquid crystal polymer may have a constitutional unit other than the constitutional units (1) to (3), but the content thereof is preferably 10% by mole or less and more preferably 5% by mole or less with respect to the total amount of all the constitutional units.

From the viewpoint of solubility in a solvent, the liquid crystal polymer preferably has, as the constitutional unit (3), a constitutional unit (3) in which at least one of X or Y is an imino group, that is, preferably has as the constitutional unit (3), at least one of a constitutional unit derived from an aromatic hydroxylamine or a constitutional unit derived from an aromatic diamine, and it is more preferable to have only a constitutional unit (3) in which at least one of X or Y is an imino group.

It is preferable that the liquid crystal polymer is produced by melt-polymerizing raw material monomers corresponding to the constitutional units constituting the liquid crystal polymer. The melt polymerization may be carried out in the presence of a catalyst. Examples of the catalyst include metal compounds such as magnesium acetate, stannous acetate, tetrabutyl titanate, lead acetate, sodium acetate, potassium acetate, and antimony trioxide, and nitrogen-containing heterocyclic compounds such as 4-(dimethylamino)pyridine and 1-methylimidazole; and preferred examples thereof include nitrogen-containing heterocyclic compounds. The melt polymerization may be further carried out by solid phase polymerization as necessary.

The lower limit value of a flow start temperature of the liquid crystal polymer is preferably 180° C., more preferably 200° C., and still more preferably 250° C., and the upper limit value of the flow start temperature thereof is preferably 350° C., more preferably 330° C., and still more preferably 300° C. In a case where the flow start temperature of the liquid crystal polymer is within the above-described range, the solubility, the heat resistance, the strength, and the rigidity are excellent, and the viscosity of the solution is appropriate.

The flow start temperature, also referred to as a flow temperature, is a temperature at which a viscosity of 4,800 Pa s (48,000 poises) is exhibited in a case where the liquid crystal polymer is melted and extruded from a nozzle having an inner diameter of 1 mm and a length of 10 mm while the temperature is raised at a rate of 4° C./min under a load of 9.8 MPa (100 kg/cm$^2$) using a capillary rheometer and is a guideline for the molecular weight of the liquid crystal polymer (see p. 95 of "Liquid Crystal Polymers—Synthesis/Molding/Applications—", written by Naoyuki Koide, CMC Corporation, Jun. 5, 1987).

In addition, a weight-average molecular weight of the liquid crystal polymer is preferably 1,000,000 or less, more preferably 3,000 to 300,000, still more preferably 5,000 to 100,000, and particularly preferably 5,000 to 30,000. In a case where the weight-average molecular weight of the liquid crystal polymer is within the above-described range, a film after heat treatment is excellent in thermal conductivity, heat resistance, strength, and rigidity in the thickness direction.

It is preferable that the liquid crystal polymer is a liquid crystal polymer that is soluble in a specific organic solvent (hereinafter, also referred to as "soluble liquid crystal polymer").

Specifically, the soluble liquid crystal polymer in the present disclosure is preferably a liquid crystal polymer in which 0.1 g or more thereof is dissolved at 25° C. in 100 g of at least one solvent selected from the group consisting of N-methylpyrrolidone, N-ethylpyrrolidone, dichloromethane, dichloroethane, chloroform, N,N-dimethylacetamide, γ-butyrolactone, dimethylformamide, ethylene glycol monobutyl ether, and ethylene glycol monoethyl ether.

—Fluorine-Based Polymer—

From the viewpoint of heat resistance and mechanical strength, the layer A preferably contains a fluorine-based polymer.

The type or the like of the fluorine-based polymer is not particularly limited, and a known fluorine-based polymer can be used.

In addition, examples of the fluorine-based polymer include a fluorinated α-olefin monomer, that is, an α-olefin monomer containing at least one fluorine atom; and a homopolymer and a copolymer optionally containing a constitutional unit derived from a non-fluorinated ethylenically unsaturated monomer reactive to the fluorinated α-olefin monomer.

Examples of the fluorinated α-olefin monomer include $CF_2=CF_2$, $CHF=CF_2$, $CH_2=CF_2$, $CHC_1=CHF$, $CC_1F=CF_2$, $CC_{12}=CF_2$, $CC_1F=CC_1F$, $CHF=CC_{12}$, $CH_2=CC_1F$, $CC_{12}=CC_1F$, $CF_3CF=CF_2$, $CF_3CF=CHF$, $CF_3CH=CF_2$, $CF_3CH=CH_2$, $CHF_2CH=CHF$, $CF_3CF=CF_2$, and perfluoro(alkyl having 2 to 8 carbon atoms) vinyl ether (for example, perfluoromethyl vinyl ether, perfluoropropyl vinyl ether, and perfluorooctyl vinyl ether). Among these, at least one monomer selected from the group consisting of tetrafluoroethylene ($CF_2=CF_2$), chlorotrifluoroethylene ($CC_1F=CF_2$), (perfluorobutyl)ethylene, vinylidene fluoride ($CH_2=CF_2$), and hexafluoropropylene ($CF_2=CFCF_3$) is preferable.

Examples of the non-fluorinated monoethylenically unsaturated monomer include ethylene, propylene, butene, and an ethylenically unsaturated aromatic monomer (for example, styrene and α-methylstyrene).

The fluorinated α-olefin monomer may be used alone or in combination of two or more thereof.

In addition, the non-fluorinated ethylenically unsaturated monomer may be used alone or in combination of two or more thereof.

Examples of the fluorine-based polymer include poly-chlorotrifluoroethylene (PCTFE), poly(chlorotrifluoroethylene-propylene), poly(ethylene-tetrafluoroethylene) (ETFE), poly(ethylene-chlorotrifluoroethylene) (ECTFE), poly (hexafluoropropylene), poly(tetrafluoroethylene) (PTFE), poly(tetrafluoroethylene-ethylene-propylene), poly(tetrafluoroethylene-hexafluoropropylene) (FEP), poly(tetrafluoroethylene-propylene) (FEPM), poly(tetrafluoroethylene-perfluoropropylene vinyl ether), poly(tetrafluoroethylene-perfluoroalkyl vinyl ether) (PFA) (for example, poly(tetrafluoroethylene-perfluoropropyl vinyl ether)), polyvinyl fluoride (PVF), polyvinylidene fluoride (PVDF), poly(vinylidene fluoride-chlorotrifluoroethylene), perfluoropolyether, perfluorosulfonic acid, and perfluoropolyoxetane.

The fluorine-based polymer may be used alone or in combination of two or more thereof.

The fluorine-based polymer is preferably at least one of FEP, PFA, ETFE, or PTFE. The FEP is available from Du Pont as the trade name of TEFLON (registered trademark) FEP or from DAIKIN INDUSTRIES, LTD. as the trade name of NEOFLON FEP; and the PFA is available from DAIKIN INDUSTRIES, LTD. as the trade name of NEOFLON PFA, from Du Pont as the trade name of TEFLON (registered trademark) PFA, or from Solvay Solexis as the trade name of HYFLON PFA.

The fluorine-based polymer preferably includes PTFE. The PTFE can be included as a PTFE homopolymer, a partially modified PTFE homopolymer, or a combination including one or both of these. The partially modified PTFE homopolymer preferably contains a constitutional unit derived from a comonomer other than tetrafluoroethylene in an amount of less than 1% by mass based on the total mass of the polymer.

The fluorine-based polymer may be a crosslinkable fluoropolymer having a crosslinkable group. The crosslinkable fluoropolymer can be crosslinked by a known crosslinking method in the related art. One of the representative crosslinkable fluoropolymers is a fluoropolymer having a (meth)acryloxy group. For example, the crosslinkable fluoropolymer can be represented by Formula: $H_2C=CR'COO—(CH_2)_n—R—(CH_2)_n—OOCR'=CH_2$, and in the formula, R is a fluorine-based oligomer chain having two or more constitutional units derived from the fluorinated α-olefin monomer or the non-fluorinated monoethylenically unsaturated monomer, R' is H or $—CH_3$, and n is 1 to 4. R may be a fluorine-based oligomer chain having a constitutional unit derived from tetrafluoroethylene.

In order to initiate a radical crosslinking reaction through the (meth)acryloxy group in the fluorine-based polymer, by exposing the fluoropolymer having a (meth)acryloxy group to a free radical source, a crosslinked fluoropolymer network can be formed. The free radical source is not particularly limited, and suitable examples thereof include a photoradical polymerization initiator and an organic peroxide. Appropriate photoradical polymerization initiators and organic peroxides are well known in the art. The crosslinkable fluoropolymer is commercially available, and examples thereof include Viton B manufactured by Du Pont.

—Polymerized Substance of Compound which has Cyclic Aliphatic Hydrocarbon Group and Group Having Ethylenically Unsaturated Bond—

The layer A preferably contains a polymerized substance of a compound which has a cyclic aliphatic hydrocarbon group and a group having an ethylenically unsaturated bond.

Examples of the polymerized substance of a compound which has a cyclic aliphatic hydrocarbon group and a group having an ethylenically unsaturated bond include thermoplastic resins having a constitutional unit formed from a monomer having a cyclic olefin such as norbornene and a polycyclic norbornene-based monomer.

The polymerized substance of a compound which has a cyclic aliphatic hydrocarbon group and a group having an ethylenically unsaturated bond may be a ring-opened polymer of the above-described cyclic olefin, a hydrogenated product of a ring-opened copolymer using two or more cyclic olefins, or an addition polymer of a cyclic olefin and a linear olefin or aromatic compound having an ethylenically unsaturated bond such as a vinyl group. In addition, a polar group may be introduced into the polymerized substance of a compound which has a cyclic aliphatic hydrocarbon group and a group having an ethylenically unsaturated bond.

The polymerized substance of a compound which has a cyclic aliphatic hydrocarbon group and a group having an ethylenically unsaturated bond may be used alone or in combination of two or more thereof.

A ring structure of the cyclic aliphatic hydrocarbon group may be a single ring, a fused ring in which two or more rings are fused, or a crosslinked ring.

Examples of the ring structure of the cyclic aliphatic hydrocarbon group include a cyclopentane ring, a cyclohexane ring, a cyclooctane ring, an isophorone ring, a norbornene ring, and a dicyclopentane ring.

The compound which has a cyclic aliphatic hydrocarbon group and a group having an ethylenically unsaturated bond may be a monofunctional ethylenically unsaturated compound or a polyfunctional ethylenically unsaturated compound.

The number of cyclic aliphatic hydrocarbon groups in the compound which has a cyclic aliphatic hydrocarbon group and a group having an ethylenically unsaturated bond may be 1 or more, and may be 2 or more.

It is sufficient that the polymerized substance of a compound which has a cyclic aliphatic hydrocarbon group and a group having an ethylenically unsaturated bond is a polymer obtained by polymerizing at least one compound which has a cyclic aliphatic hydrocarbon group and a group having an ethylenically unsaturated bond, and it may be a polymerized substance of two or more kinds of the compound which has a cyclic aliphatic hydrocarbon group and a group having an ethylenically unsaturated bond or a copolymer with other ethylenically unsaturated compounds having no cyclic aliphatic hydrocarbon group.

In addition, the polymerized substance of a compound which has a cyclic aliphatic hydrocarbon group and a group having an ethylenically unsaturated bond is preferably a cycloolefin polymer.

—Polyphenylene Ether—

The layer A preferably contains a polyphenylene ether.

In a case where heat curing is performed after film formation, from the viewpoint of heat resistance and film-forming property, a weight-average molecular weight (Mw) of the polyphenylene ether is preferably 500 to 5,000 and preferably 500 to 3,000. In addition, in a case where the heat curing is not performed, the weight-average molecular weight (Mw) of the polyphenylene ether is not particularly limited, but is preferably 3,000 to 100,000 and preferably 5,000 to 50,000.

In the polyphenylene ether, from the viewpoint of dielectric loss tangent and heat resistance, the average number of molecular terminal phenolic hydroxyl groups per molecule (the number of terminal hydroxyl groups) is preferably 1 to 5 and more preferably 1.5 to 3.

The number of hydroxyl groups or the number of phenolic hydroxyl groups in the polyphenylene ether can be found, for example, from a standard value of a product of the polyphenylene ether. In addition, examples of the number of terminal hydroxyl groups or the number of terminal phenolic hydroxyl groups include a numerical value representing an average value of hydroxyl groups or phenolic hydroxyl groups per molecule of all polyphenylene ethers present in 1 mol of the polyphenylene ether.

The polyphenylene ether may be used alone or in combination of two or more thereof.

Examples of the polyphenylene ether include a polyphenylene ether including 2,6-dimethylphenol and at least one of bifunctional phenol or trifunctional phenol, and a compound mainly including the polyphenylene ether, such as poly(2,6-dimethyl-1,4-phenylene oxide). More specifically, for example, a compound having a structure represented by Formula (PPE) is preferable.

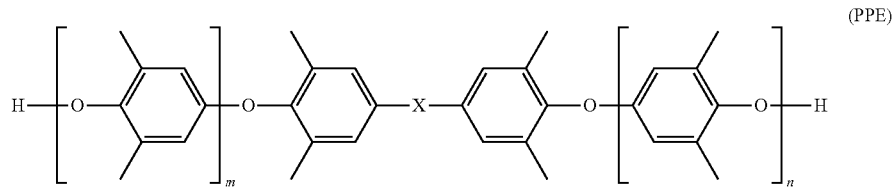
(PPE)

In Formula (PPE), X represents an alkylene group having 1 to 3 carbon atoms or a single bond, m represents an integer of 0 to 20, n represents an integer of 0 to 20, and the sum of m and n represents an integer of 1 to 30.

Examples of the alkylene group in X described above include a dimethylmethylene group.

—Aromatic Polyether Ketone—

The layer A preferably contains an aromatic polyether ketone.

The aromatic polyether ketone is not particularly limited, and a known aromatic polyether ketone can be used.

The aromatic polyether ketone is preferably a polyether ether ketone.

The polyether ether ketone is one type of the aromatic polyether ketone, and is a polymer in which bonds are arranged in the order of an ether bond, an ether bond, and a carbonyl bond (ketone). It is preferable that the bonds are linked to each other by a divalent aromatic group.

The aromatic polyether ketone may be used alone or in combination of two or more thereof.

Examples of the aromatic polyether ketone include polyether ether ketone (PEEK) having a chemical structure represented by Formula (P1), polyether ketone (PEK) having a chemical structure represented by Formula (P2), polyether ketone ketone (PEKK) having a chemical structure represented by Formula (P3), polyether ether ketone ketone (PEEKK) having a chemical structure represented by Formula (P4), and polyether ketone ether ketone ketone (PEKEKK) having a chemical structure represented by Formula (P5).

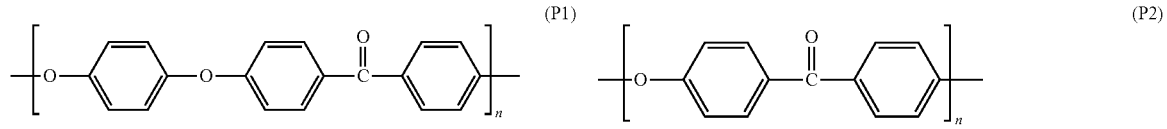
(P1)　(P2)

(P3)

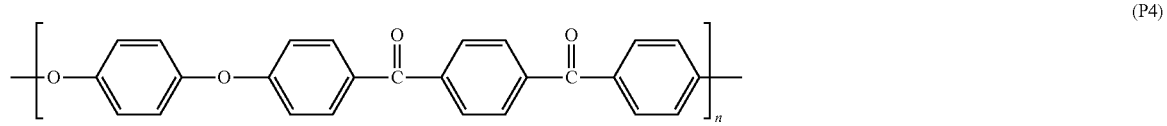
(P4)

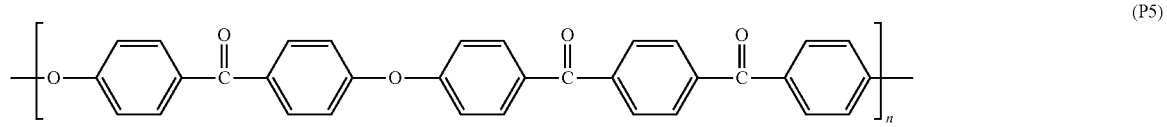
(P5)

From the viewpoint of mechanical properties, each n of Formulae (P1) to (P5) is preferably 10 or more and more preferably 20 or more. On the other hand, from the viewpoint that the aromatic polyether ketone can be easily produced, n is preferably 5,000 or less and more preferably 1,000 or less. That is, n is preferably 10 to 5,000 and more preferably 20 to 1,000.

—Polymer Having Dielectric Loss Tangent of 0.01 or Less—

In the first embodiment of the polymer film according to the present disclosure, the layer A contains a polymer having a dielectric loss tangent of 0.01 or less.

The polymer having a dielectric loss tangent of 0.01 or less is not particularly limited, and among known polymers, a polymer which has a dielectric loss tangent of 0.01 or less can be used.

From the viewpoint of dielectric loss tangent of the polymer film and adhesiveness with the metal layer, a dielectric loss tangent of the polymer having a dielectric loss tangent of 0.01 or less is preferably 0.008 or less, more preferably 0.0075 or less, still more preferably 0.006 or less, even more preferably 0.005 or less, particularly preferably 0.004 or less, and most preferably more than 0 and 0.003 or less.

Examples of the polymer having a dielectric loss tangent of 0.01 or less include thermoplastic resins such as a liquid crystal polymer, a fluorine-based polymer, a polymer of a compound which has a cyclic aliphatic hydrocarbon group and a group having an ethylenically unsaturated bond, polyphenylene ether, aromatic polyether ketone, polyolefin, polyamide, polyester, polyphenylene sulfide, polyether ketone, polycarbonate, polyethersulfone, and polyetherimide; elastomers such as a copolymer of glycidyl methacrylate and polyethylene; and thermosetting resins such as a phenol resin, an epoxy resin, a polyimide resin, and a cyanate resin.

Among these, from the viewpoint of reducing the dielectric loss tangent of the polymer film, the layer A preferably contains at least one selected from the group consisting of a fluorine-based polymer, a polymer of a compound which has a cyclic aliphatic hydrocarbon group and a group having an ethylenically unsaturated bond, and polyether ether ketone, and more preferably contains at least one selected from the group consisting of a liquid crystal polymer and a fluorine-based polymer. From the viewpoint of film-forming properties and mechanical strength, it is particularly preferable to contain a liquid crystal polymer, and from the viewpoint of dielectric loss tangent, it is particularly preferable to contain a fluorine-based polymer.

The layer A may contain only one or two or more kinds of at least one polymer selected from the group consisting of a fluorine-based polymer, a polymerized substance of a compound which has a cyclic aliphatic hydrocarbon group and a group having an ethylenically unsaturated bond, a polyphenylene ether, and an aromatic polyether ketone, the polymer having a dielectric loss tangent of 0.01 or less, or the liquid crystal polymer.

From the viewpoint of linear expansion coefficient and adhesiveness with the metal layer, a content of at least one polymer selected from the group consisting of a fluorine-based polymer, a polymerized substance of a compound which has a cyclic aliphatic hydrocarbon group and a group having an ethylenically unsaturated bond, a polyphenylene ether, and an aromatic polyether ketone, the polymer having a dielectric loss tangent of 0.01 or less, or the liquid crystal polymer in the layer A is preferably 20% by volume to 100% by volume, more preferably 20% by volume to 90% by volume, still more preferably 30% by volume to 80% by volume, and particularly preferably 40% by volume to 70% by volume with respect to the total volume of the layer A. A content of the liquid crystal polymer is preferably 15% by mass to 85% by mass, and more preferably 20% by mass to 70% by mass with respect to the total mass of the layer A.

—Filler—

In the polymer film, from the viewpoint of linear expansion coefficient and adhesiveness with the metal layer, it is preferable that at least one of the layers contains a filler, and it is more preferable that the layer A contains a filler.

The filler may be particulate or fibrous, and may be an inorganic filler or an organic filler.

In the polymer film according to the embodiment of the present disclosure, from the viewpoint of linear expansion coefficient and adhesiveness with the metal layer, it is preferable that a number density of the above-described filler is higher inside the above-described polymer film than on the surface of the above-described polymer film. Here, the surface of the polymer film refers to an outer surface (a surface in contact with air or the substrate) of the polymer film, and the smaller of a range of 3 μm in a depth direction from the most surface and a range of 10% or less of the thickness of the entire polymer film from the most surface is defined as the "surface". The inside of the polymer film refers to a portion other than the surface of the polymer film, that is, an inner surface of the polymer film (a surface which is not in contact with air or the substrate), which is not limited. The smaller numerical value of a range of ±1.5 μm from a center of the polymer film in a thickness direction and a range of ±5% of the total thickness of the polymer film from the center in the thickness direction is defined as the "inside".

As the inorganic filler, a known inorganic filler can be used.

Examples of a material of the inorganic filler include BN, $Al_2O_3$, AlN, $TiO_2$, $SiO_2$, barium titanate, strontium titanate, aluminum hydroxide, calcium carbonate, and a material containing two or more of these.

Among these, as the inorganic filler, from the viewpoint of linear expansion coefficient and adhesiveness with the metal layer, metal oxide particles or fibers are preferable, silica particles, titania particles, or glass fibers are more preferable, and silica particles or glass fibers are particularly preferable.

An average particle diameter of the inorganic filler is preferably approximately 20% to approximately 40% of the thickness of the layer A, and for example, the average particle diameter may be selected from 25%, 30%, or 35% of the thickness of the layer A. In a case where the particles or fibers are flat, the average particle diameter indicates a length in a short side direction.

In addition, from the viewpoint of linear expansion coefficient and adhesiveness with the metal layer, the average particle diameter of the inorganic filler is preferably 5 nm to 20 μm, more preferably 10 nm to 10 μm, still more preferably 20 nm to 1 μm, and particularly preferably 25 nm to 500 nm.

As the organic filler, a known organic filler can be used.

Examples of a material of the organic filler include polyethylene, polystyrene, urea-formalin filler, polyester, cellulose, acrylic resin, fluororesin, cured epoxy resin, crosslinked benzoguanamine resin, crosslinked acrylic resin, a liquid crystal polymer, and a material containing two or more kinds of these.

In addition, the organic filler may be fibrous, such as nanofibers, or may be hollow resin particles.

Among these, as the organic filler, from the viewpoint of linear expansion coefficient and adhesiveness with the metal layer, fluororesin particles, polyester-based resin particles, polyethylene particles, liquid crystal polymer particles, or cellulose-based resin nanofibers are preferable, and polytetrafluoroethylene particles, polyethylene particles, or liquid crystal polymer particles are more preferable. Here, the liquid crystal polymer particles are not limited, but refer to particles obtained by polymerizing a liquid crystal polymer and crushing the liquid crystal polymer with a crusher or the like to obtain powdery liquid crystal. The liquid crystal polymer particles are preferably smaller than the thickness of each layer.

From the viewpoint of linear expansion coefficient and adhesiveness with the metal layer, an average particle diameter of the organic filler is preferably 5 nm to 20 µm, more preferably 10 nm to 1 µm, still more preferably 20 nm to 500 nm, and particularly preferably 25 nm to 90 nm.

The layer A may contain only one or two or more kinds of the fillers.

From the viewpoint of linear expansion coefficient and adhesiveness with the metal layer, a content of the filler in the layer A is preferably 5% by volume to 80% by volume, more preferably 10% by volume to 70% by volume, still more preferably 20% by volume to 70% by volume, and particularly preferably 30% by volume to 60% by volume with respect to the total volume of the layer A.

—Other Additives—

The layer A may contain an additive other than the above-described polymer such as a liquid crystal polymer and the filler.

Known additives can be used as other additives. Specific examples of the other additives include a leveling agent, an antifoaming agent, an antioxidant, an ultraviolet absorbing agent, a flame retardant, and a colorant.

In addition, the layer A may contain, as the other additives, a resin other than the liquid crystal polymer.

Examples of the resin other than the liquid crystal polymer include thermoplastic resins other than liquid crystal polyester, such as polypropylene, polyamide, polyester other than liquid crystal polyester, polyphenylene sulfide, polyether ketone, polycarbonate, polyethersulfone, polyphenylene ether and a modified product thereof, and polyetherimide; elastomers such as a copolymer of glycidyl methacrylate and polyethylene; and thermosetting resins such as a phenol resin, an epoxy resin, a polyimide resin, and a cyanate resin.

The total content of the other additives in the layer A is preferably 25 parts by mass or less, more preferably 10 parts by mass or less, and still more preferably 5 parts by mass or less with respect to 100 parts by mass of the content of the polymer.

An average thickness of the layer A is not particularly limited, but from the viewpoint of linear expansion coefficient and adhesiveness with the metal layer, the average thickness thereof is preferably 5 µm to 90 µm, more preferably 10 µm to 70 µm, and particularly preferably 15 µm to 50 µm.

A method for measuring the average thickness of each layer in the polymer film according to the embodiment of the present disclosure is as follows.

The thickness of each layer is evaluated by cutting the polymer film with a microtome and observing the cross section with an optical microscope. Three or more sites of the cross-sectional sample are cut out, the thickness is measured at three or more points in each cross section, and the average value thereof is defined as the average thickness.

<Layer B>

The polymer film according to the embodiment of the present disclosure includes a layer A and a layer B on at least one surface of the layer A. By including the layer B, a polymer film having excellent adhesiveness with the metal layer is obtained. For example, in a case where the layer A has a filler, it is presumed that, by including the layer B and the layer A brittle due to the addition of the filler, the surface of the polymer film is improved, and effects such as improvement in adhesiveness are obtained.

In addition, the layer B is preferably a surface layer (outermost layer). For example, in a case where the polymer film is used as a laminate (laminated plate with a metal layer) having a layer configuration of metal layer/layer A/layer B, another metal layer or laminated plate with a metal layer may be further disposed on the layer B side. In this case, interface destruction between the layer B and another metal layer in the laminate is suppressed, and the adhesiveness with the metal layer is improved.

From the viewpoint of linear expansion coefficient and adhesiveness with the metal layer, the layer B preferably contains at least one polymer selected from the group consisting of a fluorine-based polymer, a polymerized substance of a compound which has a cyclic aliphatic hydrocarbon group and a group having an ethylenically unsaturated bond, a polyphenylene ether, an aromatic polyether ketone, a polymer having a dielectric loss tangent of 0.01 or less, and a liquid crystal polymer, and more preferably contains a liquid crystal polymer.

Preferred aspects of the polymer which is used in the layer B are the same as the preferred aspects of the liquid crystal polymer which is used in the layer A, except as described below.

The above-described polymer contained in the layer B may be the same as or different from the above-described polymer contained in the layer A, but from the viewpoint of adhesiveness between the layer A and the layer B, it is preferable to be the same as the above-described polymer contained in the layer A.

In addition, it is preferable that the polymer contained in the layer B contains a polymer having a higher breaking strength (toughness) that the polymer contained in the layer A.

The breaking strength is measured by the following method.

A sample including the polymer to be measured is produced, and using a universal tensile tester "STM T50BP" manufactured by Toyo Baldwin Co., Ltd., a stress against elongation is measured at a tensile rate of 10%/min in an atmosphere of 25° C. and 60% RH to obtain the breaking strength.

From the viewpoint of adhesiveness with the metal layer, it is preferable that a content of at least one polymer selected from the group consisting of a fluorine-based polymer, a polymerized substance of a compound which has a cyclic aliphatic hydrocarbon group and a group having an ethylenically unsaturated bond, a polyphenylene ether, an aromatic polyether ketone, a polymer having a dielectric loss tangent of 0.01 or less, and a liquid crystal polymer in the layer B is larger than the content of at least one polymer selected from the group consisting of a fluorine-based polymer, a polymerized substance of a compound which has a cyclic aliphatic hydrocarbon group and a group having an ethylenically unsaturated bond, a polyphenylene ether, an aromatic polyether ketone, a polymer having a dielectric loss tangent of 0.01 or less, and a liquid crystal polymer in the layer A.

In addition, from the viewpoint of adhesiveness with the metal layer, the content of the polymer, preferably at least one polymer selected from the group consisting of a fluorine-based polymer, a polymerized substance of a compound which has a cyclic aliphatic hydrocarbon group and a group having an ethylenically unsaturated bond, a polyphenylene ether, an aromatic polyether ketone, a polymer having a dielectric loss tangent of 0.01 or less, and a liquid crystal polymer in the layer B is preferably 50% by volume to 100% by volume, more preferably 80% by volume to 100% by volume, still more preferably 90% by volume to 100% by volume, and particularly preferably 95% by volume to 100% by volume with respect to the total volume of the layer B.

The layer B may contain a filler.

Preferred aspects of the filler which is used in the layer B are the same as the preferred aspects of the filler which is used in the layer A, except as described below.

From the viewpoint of adjusting brittleness of the polymer film by addition, it is preferable that a content of the filler in a case of an inorganic filler (for example, silica particles) in the layer B is smaller than the content of the filler in the layer A in terms of adhesiveness with the metal layer. On the other hand, in a case of an organic filler (for example, polyethylene particles) in which the decrease in brittleness of the polymer film is small due to the addition, an arbitrary addition amount can be set.

In addition, from the viewpoint of adhesiveness with the metal layer, it is preferable that the layer B does not contain the filler or the content of the filler in the layer B is more than 0% by volume and 20% by volume or less with respect to the total volume of the layer B; it is more preferable that the layer B does not contain the filler or the content of the filler in the layer B is more than 0% by volume and 10% by volume or less with respect to the total volume of the layer B; it is still more preferable that the layer B does not contain the filler or the content of the filler in the layer B is more than 0% by volume and 5% by volume or less with respect to the total volume of the layer B; and it is particularly preferable that the layer B does not contain the filler. The content of the filler in the layer B is preferably 0% by mass to 15% by mass, and more preferably 0% by mass to 5% by mass with respect to the total mass of the layer B.

A content of a filler such as polyethylene and an olefin-based elastomer is, for example, preferably 50% by volume to 90% by volume, and more preferably 75% by volume to 85% by volume. In this case, the content of the filler in the layer B is preferably 55% by mass to 90% by mass, and more preferably 80% by mass to 85% by mass with respect to the total mass of the layer B.

The layer B may contain an additive other than the above-described polymer such as a liquid crystal polymer and the filler.

Preferred aspects of other additives which are used in the layer B are the same as the preferred aspects of other additives which are used in the layer A, except as described below.

From the viewpoint of linear expansion coefficient and adhesiveness with the metal layer, it is preferable that an average thickness of the layer B is smaller than the average thickness of the layer A.

From the viewpoint of linear expansion coefficient and adhesiveness with the metal layer, a value of $T^A/T^B$, which is a ratio of an average thickness $T^A$ of the layer A to an average thickness $T^B$ of the layer B, is preferably more than 1, more preferably 2 to 100, still more preferably 2.5 to 20, and particularly preferably 3 to 10.

In addition, from the viewpoint of linear expansion coefficient and adhesiveness with the metal layer, the average thickness of the layer B is preferably 0.1 µm to 20 µm, more preferably 0.5 µm to 15 µm, still more preferably 1 µm to 10 µm, and particularly preferably 3 µm to 8 µm.

<Layer C>

It is preferable that the polymer film according to the embodiment of the present disclosure further includes a layer C, and from the viewpoint of adhesiveness with the metal layer, it is more preferable that the above-described layer B, the above-described layer A, and the layer C are provided in this order.

In addition, the layer C is preferably a surface layer (outermost layer), and more preferably a surface layer on a side to which the metal is attached.

In addition, in a case where the polymer film according to the embodiment of the present disclosure is used as a laminate having a metal layer (for example, a metal foil or a metal wire), it is preferable that the layer C is disposed between the metal layer and the layer A.

From the viewpoint of linear expansion coefficient and adhesiveness with the metal layer, the layer C preferably contains at least one polymer selected from the group consisting of a fluorine-based polymer, a polymerized substance of a compound which has a cyclic aliphatic hydrocarbon group and a group having an ethylenically unsaturated bond, a polyphenylene ether, an aromatic polyether ketone, a polymer having a dielectric loss tangent of 0.01 or less, and a liquid crystal polymer, and more preferably contains a liquid crystal polymer.

Preferred aspects of the above-described polymer which is used in the layer C are the same as the preferred aspects of the above-described polymer which is used in the layer A, except as described below.

The above-described polymer contained in the layer C may be the same as or different from the above-described polymer contained in the layer A or in the layer B, but from the viewpoint of adhesiveness between the layer A and the layer C, it is preferable to be the same as the above-described polymer contained in the layer A.

From the viewpoint of adhesiveness with the metal layer, it is preferable that a content of at least one polymer selected from the group consisting of a fluorine-based polymer, a polymerized substance of a compound which has a cyclic aliphatic hydrocarbon group and a group having an ethylenically unsaturated bond, a polyphenylene ether, an aromatic polyether ketone, a polymer having a dielectric loss tangent of 0.01 or less, and a liquid crystal polymer in the layer C is larger than the content of at least one polymer selected from the group consisting of a fluorine-based polymer, a polymerized substance of a compound which has a cyclic aliphatic hydrocarbon group and a group having an ethylenically unsaturated bond, a polyphenylene ether, an aromatic polyether ketone, a polymer having a dielectric loss tangent of 0.01 or less, and a liquid crystal polymer in the layer A.

In addition, from the viewpoint of adhesiveness with the metal layer, the content of the polymer, preferably at least one polymer selected from the group consisting of a fluorine-based polymer, a polymerized substance of a compound which has a cyclic aliphatic hydrocarbon group and a group having an ethylenically unsaturated bond, a polyphenylene ether, an aromatic polyether ketone, a polymer having a dielectric loss tangent of 0.01 or less, and a liquid crystal polymer in the layer C is preferably 50% by volume to 100% by volume, more preferably 80% by volume to 100% by volume, still more preferably 90% by volume to 100% by volume, and particularly preferably 95% by volume to 100% by volume with respect to the total volume of the layer C.

The layer C may contain a filler.

Preferred aspects of the filler which is used in the layer C are the same as the preferred aspects of the filler which is used in the layer A, except as described below.

From the viewpoint of adhesiveness with the metal layer, it is preferable that a content of the filler in the layer C is smaller than a content of the filler in the layer A.

In addition, from the viewpoint of adhesiveness with the metal layer, it is preferable that the layer C does not contain the filler or the content of the filler in the layer C is more than 0% by volume and 20% by volume or less with respect to the total volume of the layer C; it is more preferable that the layer C does not contain the filler or the content of the filler in the layer C is more than 0% by volume and 10% by volume or less with respect to the total volume of the layer C; it is still more preferable that the layer C does not contain the filler or the content of the filler in the layer C is more than 0% by volume and 5% by volume or less with respect to the total volume of the layer C; and it is particularly preferable that the layer C does not contain the filler.

The content of the filler in the layer C is preferably 0% by mass to 15% by mass, and more preferably 0% by mass to 5% by mass with respect to the total mass of the layer C.

A content of a filler such as polyethylene and an olefin-based elastomer is, for example, preferably 50% by volume to 90% by volume, and more preferably 75% by volume to 85% by volume. In this case, the content of the filler in the layer C is preferably 55% by mass to 90% by mass, and more preferably 80% by mass to 85% by mass with respect to the total mass of the layer C.

The layer C may contain an additive other than the above-described polymer such as a liquid crystal polymer and the filler.

Preferred aspects of other additives which are used in the layer C are the same as the preferred aspects of other additives which are used in the layer A, except as described below.

The layer C preferably contains a compound having a functional group as the other additives.

The above-described functional group is preferably at least one group selected from the group consisting of a covalent-bondable group, an ion-bondable group, a hydrogen-bondable group, a dipole-interactable group, and a curing reactive group.

The compound having a functional group may be a low-molecular-weight compound or a high-molecular-weight compound.

From the viewpoint of compatibility between the above-described polymer and the compound having a functional group and viewpoint of dielectric loss tangent of the polymer film, the compound having a functional group is preferably a low-molecular-weight compound, and from the viewpoint of heat resistance of the polymer film and mechanical strength, the compound having a functional group is preferably a high-molecular-weight compound.

It is sufficient that the number of functional groups in the compound having a functional group is 1 or more, and it may be 2 or more. However, the number of functional groups in the compound having a functional group is preferably 2 or more, and from the viewpoint of reducing the dielectric loss tangent of the polymer film by setting the amount of functional groups to an appropriate amount, it is preferably 10 or less.

In addition, the compound having a functional group may have only one kind of functional group, or two or more kinds of functional groups.

From the viewpoint of adhesiveness with the metal layer, the low-molecular-weight compound used as the compound having a functional group preferably has a molecular weight of 50 or more and less than 2,000, more preferably has a molecular weight of 100 or more and less than 1,000, and particularly preferably has a molecular weight of 200 or more and less than 1,000.

In a case where the compound having a functional group is a low-molecular-weight compound, the spread of the compound is narrow, and in order to increase the contact probability between the functional groups, a content of the compound having a functional group is preferably 10% by mass or more with respect to the total mass of the layer B.

In addition, from the viewpoint of adhesiveness with the metal layer, the high-molecular-weight compound used as the compound having a functional group is preferably a polymer having a weight-average molecular weight of 1,000 or more, more preferably a polymer having a weight-average molecular weight of 2,000 or more, still more preferably a polymer having a weight-average molecular weight of 3,000 or more and 1,000,000 or less, and particularly preferably a polymer having a weight-average molecular weight of 5,000 or more and 200,000 or less.

Furthermore, from the viewpoint of dielectric loss tangent of the polymer film and adhesiveness with the metal layer, it is preferable that the polymer having a dielectric loss tangent of 0.01 or less and the compound having a functional group are compatible with each other.

From the viewpoint of compatibility between the above-described polymer and the compound having a functional group, dielectric loss tangent of the polymer film, and adhesiveness with the metal layer, a difference between an SP value of the polymer having a dielectric loss tangent of 0.01 or less, which is determined by Hoy method, and an SP value of the compound having a functional group, which is determined by Hoy method, is preferably 5 $MPa^{0.5}$ or less. The lower limit value thereof is 0 $MPa^{0.5}$.

The solubility parameter value (SP value) determined by Hoy method is calculated from the molecular structure of the resin by the method described in Polymer Handbook fourth edition. In addition, in a case where the resin is a mixture of a plurality types of resins, the SP value is obtained by calculating an SP value of each constitutional unit.

<<Functional Group>>

The functional group in the compound having a functional group is preferably at least one group selected from the group consisting of a covalent-bondable group, an ion-bondable group, a hydrogen-bondable group, a dipole-interactable group, and a curing reactive group.

From the viewpoint of adhesiveness between the layer C and the metal layer, the functional group is preferably a covalent-bondable group or a curing reactive group, and more preferably a covalent-bondable group.

In addition, from the viewpoint of storage stability and handleability, the functional group is preferably an ion-bondable group, a hydrogen-bondable group, or a dipole-interactable group.

—Covalent-Bondable Group—

The covalent-bondable group is not particularly limited as long as the group is capable of forming a covalent bond, and examples thereof include an epoxy group, an oxetanyl group, an isocyanate group, an acid anhydride group, a carbodiimide group, a N-hydroxy ester group, a glyoxal group, an imide ester group, a halogenated alkyl group, a thiol group, a hydroxy group, a carboxy group, an amino group, an amide group, an isocyanate group, an aldehyde group, and a sulfonic acid group. Among these, from the viewpoint of adhesiveness between the layer C and the metal layer, the covalent-bondable group is preferably at least one functional group selected from the group consisting of an epoxy group, an oxetanyl group, an N-hydroxy ester group, an isocyanate group, an imide ester group, a halogenated alkyl group, and a thiol group, and particularly preferably an epoxy group.

In addition, as will be described later, it is preferable that the surface of the metal to be bonded to the layer C has a group which is paired with the functional group in the compound having a functional group.

Examples of a combination of the covalent-bondable group and a group which can be paired with the covalent-bondable group (a combination of the functional group in the compound having a functional group and the group present in the surface of the metal) include an aspect in which, for example, in a case where one is an epoxy group or an oxetanyl group, the other is a hydroxy group or an amino group.

Examples thereof also include an aspect in which, for example, in a case where one in the above-described combination is an N-hydroxy ester group or an imide ester group, the other is an amino group.

—Ion-Bondable Group—

Examples of the ion-bondable group include a cationic group and an anionic group.

The above-described cationic group is preferably an onium group. Examples of the onium group include an ammonium group, a pyridinium group, a phosphonium group, an oxonium group, a sulfonium group, a selenonium group, and an iodonium group. Among these, from the viewpoint of adhesiveness between the layer C and the metal layer, an ammonium group, a pyridinium group, a phosphonium group, or a sulfonium group is preferable, an ammonium group or a phosphonium group is more preferable, and an ammonium group is particularly preferable.

The anionic group is not particularly limited, and examples thereof include a phenolic hydroxyl group, a carboxy group, —SO$_3$H, —OSO$_3$H, —POSH, —OPO$_3$H$_2$, —CONHSO$_2$—, and —SO$_2$NHSO$_2$—. Among these, a phosphoric acid group, a phosphonic acid group, a phosphinic acid group, a sulfuric acid group, a sulfonic acid group, a sulfinic acid group, or a carboxy group is preferable, a phosphoric acid group or a carboxy group is more preferable, and a carboxy group is still more preferable.

Examples of a combination of the ion-bondable group and a group which can be paired with the ion-bondable group (a combination of the functional group in the compound having a functional group and the group present in the surface of the metal) include an aspect in which, for example, in a case where one is an acidic group, the other is a basic group.

Examples of the above-described acidic group include a carboxy group, a sulfo group, and a phosphoric acid group, and a carboxy group is preferable.

In addition, examples thereof include an aspect in which, for example, in a case where one in the above-described combination is a carboxy group, the ion-bondable group with the carboxy group is a tertiary amino group, a pyridyl group, or a piperidyl group.

—Hydrogen-Bondable Group—

Examples of the hydrogen-bondable group include a group having a hydrogen-bond-donating moiety and a group having a hydrogen-bond-accepting moiety.

It is sufficient that the hydrogen-bond-donating moiety has a structure having an active hydrogen atom capable of hydrogen bonding, and a structure represented by X-H is preferable.

X represents a heteroatom, and is preferably a nitrogen atom or an oxygen atom.

From the viewpoint of adhesiveness between the layer C and the metal layer, as the above-described hydrogen-bond-donating moiety, at least one structure selected from the group consisting of a hydroxy group, a carboxy group, a primary amide group, a secondary amide group, a primary amino group, a secondary amino group, a primary sulfonamide group, a secondary sulfonamide group, an imide group, a urea bond, and a urethane bond is preferable; at least one structure selected from the group consisting of a hydroxy group, a carboxy group, a primary amide group, a secondary amide group, a primary sulfonamide group, a secondary sulfonamide group, a maleimide group, a urea bond, and a urethane bond is more preferable; at least one structure selected from the group consisting of a hydroxy group, a carboxy group, a primary amide group, a secondary amide group, a primary sulfonamide group, a secondary sulfonamide group, and a maleimide group is still more preferable; and at least one structure selected from the group consisting of a hydroxy group and a secondary amide group is particularly preferable.

The above-described hydrogen-bond-accepting moiety may be a structure containing an atom with an unshared electron pair, and a structure containing an oxygen atom with an unshared electron pair is preferable; at least one structure selected from the group consisting of a carbonyl group (including a carbonyl structure such as a carboxy group, an amide group, an imide group, a urea bond, and a urethane bond) and a sulfonyl group (including a sulfonyl structure such as a sulfonamide group) is more preferable; and a carbonyl group (including a carbonyl structure such as a carboxy group, an amide group, an imide group, a urea bond, and a urethane bond) is particularly preferable.

As the hydrogen-bondable group, a group having both the hydrogen-bond-donating moiety and the hydrogen-bond-accepting moiety described above is preferable; it is preferable to have a carboxy group, an amide group, an imide group, a urea bond, a urethane bond, or a sulfonamide group, and it is more preferable to have a carboxy group, an amide group, an imide group, or a sulfonamide group.

Examples of a combination of the hydrogen-bondable group and a group which can be paired with the hydrogen-bondable group (a combination of the functional group in the compound having a functional group and the group present in the surface of the metal) include an aspect in which, in a case where one is a group having a hydrogen-bond-donating moiety, the other is a group having a hydrogen-bond-accepting moiety.

Examples thereof include an aspect in which, in a case where one in the above-described combination is a carboxy group, the other is an amide group or a carboxy group.

Examples thereof also include an aspect in which, in a case where one in the above-described combination is a phenolic hydroxyl group, the other is a phenolic hydroxide.

—Dipole-Interactable Group—

It is sufficient that the dipole-interactable group is a group having a polarized structure other than the above-described structure represented by X-H (X represents a heteroatom, for example, a nitrogen atom or an oxygen atom) in the hydrogen-bondable group, and suitable examples thereof include a group in which atoms with different electronegativities are bonded to each other.

As a combination of the atoms with different electronegativities, a combination of at least one atom selected from the group consisting of an oxygen atom, a nitrogen atom, a sulfur atom, a halogen atom, and a carbon atom is preferable; and a combination of at least one atom selected from the group consisting of an oxygen atom, a nitrogen atom, and a sulfur atom, and a carbon atom is more preferable.

Among these, from the viewpoint of adhesiveness between the layer C and the metal layer, a combination of a nitrogen atom and a carbon atom or a combination of a carbon atom, a nitrogen atom, an oxygen atom, and a sulfur atom is preferable, and specifically, a cyano group, a cyanuric group, or a sulfonic acid amide group is more preferable.

Preferred examples of a combination of the dipole-interactable group and a group which can be paired with the dipole-interactable group (a combination of the functional group in the compound having a functional group and the group present in the surface of the metal) include a combination of identical dipole-interactable groups.

Examples thereof include an aspect in which, in a case where one in the above-described combination is a cyano group, the other is a cyano group.

Examples thereof also include an aspect in which, in a case where one in the above-described combination is a sulfonic acid amide group, the other is a sulfonic acid amide group.

—Curing Reactive Group—

Examples of the curing reactive group include an ethylenically unsaturated group, a cyclic ether group, a cyanato group, a reactive silyl group, an oxazine ring group, and a urethane group.

The following curable compound may be used as the compound having a curing reactive group.

—Curable Compound—

The curable compound is a compound which is cured by irradiation with heat or light (for example, visible light, ultraviolet rays, near-infrared rays, far-infrared rays, electron beam, or the like), may require a curing aid described later. Examples of such a curable compound include an epoxy compound, a cyanate ester compound, a vinyl compound, a silicone compound, an oxazine compound, a maleimide compound, an allyl compound, an acrylic compound, a methacrylic compound, and a urethane compound. These may be used alone or in combination of two or more thereof. Among these, from the viewpoint of characteristics such as compatibility with the above-described polymer and heat resistance, at least one selected from the group consisting of an epoxy compound, a cyanate ester compound, a vinyl compound, a silicone compound, an oxazine compound, a maleimide compound, and an allyl compound is preferable; and at least one selected from the group consisting of an epoxy compound, a cyanate ester compound, a vinyl compound, an allyl compound, and a silicone compound is more preferable.

A content of the curable compound in the layer B is preferably 10% by mass or more and 90% by mass or less, and more preferably 20% by mass or more and 80% by mass or less with respect to the total mass of the layer C.

—Curing Aid—

Examples of the curing aid include polymerization initiators such as a photoreaction initiator (a photoradical generator, a photoacid generator, or a photobase generator). Specific examples of the curing aid include an onium salt compound, a sulfone compound, a sulfonate compound, a sulfonimide compound, a disulfonyldiazomethane compound, a disulfonylmethane compound, an oximesulfonate compound, a hydrazinesulfonate compound, a triazine compound, a nitrobenzyl compound, a benzylimidazole compound, organic halides, octylic acid metal salt, and disulfone. These curing aids may be used alone or in combination of two or more thereof, regardless of the type.

A content of the curing aid in the layer B is preferably 5% by mass or more and 20% by mass or less, and more preferably 5% by mass or more and 10% by mass or less with respect to the total mass of the layer B.

As the functional group in the compound having a functional group, specifically, it is preferable to have an epoxy group, an oxetanyl group, an isocyanate group, an acid anhydride group, a carbodiimide group, an N-hydroxy ester group, a glyoxal group, an imidoester group, a halogenated alkyl group, a thiol group, a hydroxy group, a carboxy group, an amino group, an amide group, an isocyanate group, an aldehyde group, a sulfuric acid group, a sulfonic acid group, an ammonium group, a pyridinium group, a phosphonium group, an oxonium group, a sulfonium group, a selenonium group, an iodonium group, a phosphoric acid group, a phosphonic acid group, a phosphinic acid group, a sulfonic acid group, or at least one selected from the group consisting of a sulfinic acid group or a carboxy group, a hydroxy group, a carboxy group, a primary amide group, a secondary amide group, a primary amino group, a secondary amino group, a primary sulfonamide group, a secondary sulfonamide group, an imide group, a urea bond, and a urethane bond. From the viewpoint of improving the adhesiveness, an epoxy group, an oxetanyl group, an isocyanate group, an acid anhydride group, a carbodiimide group, an N-hydroxy ester group, a glyoxal group, an imidoester group, a halogenated alkyl group, or a thiol group is more preferable.

Specific examples of the bonds or interaction between two kinds of the functional groups are described below, but the bonds or interaction in the present disclosure is not limited thereto.

Covalent Bond

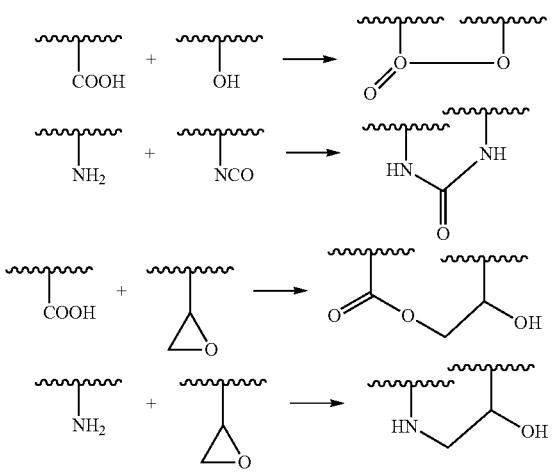

Ion Bond

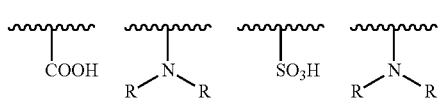

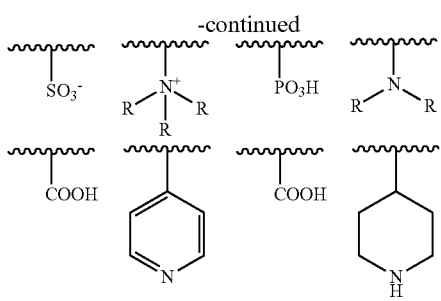

Hydrogen Bond

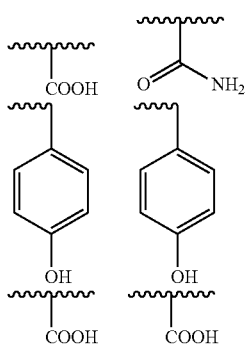

Dipole Interaction

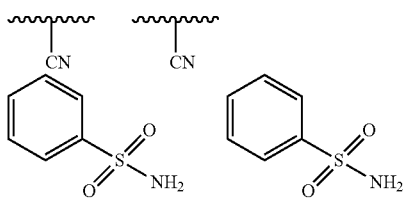

From the viewpoint of dielectric loss tangent of the polymer film and adhesiveness with the metal layer, the compound having a functional group is preferably a polyfunctional epoxy compound or a polymer of a polyfunctional epoxy compound, more preferably a bifunctional epoxy compound or a polymer of a bifunctional epoxy compound, and particularly preferably a bifunctional epoxy compound.

The layer C may contain only one or two or more kinds of the compounds having a functional group.

From the viewpoint of dielectric loss tangent of the polymer film and adhesiveness with the metal layer, a content of the compound having a functional group in the layer C is preferably 1% by mass to 80% by mass, more preferably 5% by mass to 70% by mass, still more preferably 10% by mass to 60% by mass, and particularly preferably 20% by mass to 60% by mass with respect to the total mass of the polymer film.

From the viewpoint of linear expansion coefficient and adhesiveness with the metal layer, it is preferable that an average thickness of the layer C is smaller than the average thickness of the layer A.

From the viewpoint of linear expansion coefficient and adhesiveness with the metal layer, a value of $T^A/T^C$, which is a ratio of an average thickness $T^A$ of the layer A to an average thickness $T^C$ of the layer C, is preferably more than 1, more preferably 2 to 100, still more preferably 2.5 to 20, and particularly preferably 3 to 14.

In addition, from the viewpoint of linear expansion coefficient and adhesiveness with the metal layer, a value of $T^C/T^B$, which is a ratio of the average thickness $T^C$ of the layer C to the average thickness $T^B$ of the layer B, is preferably 0.05 to 10, more preferably 0.05 to 2, and particularly preferably 0.8 to 1.5.

Furthermore, from the viewpoint of linear expansion coefficient and adhesiveness with the metal layer, the average thickness of the layer C is preferably 0.1 μm to 20 μm, more preferably 0.5 μm to 15 μm, still more preferably 1 μm to 10 μm, and particularly preferably 3 μm to 8 μm.

From the viewpoint of strength and electrical characteristics (characteristic impedance) in a case where a laminate having the metal layer (particularly, the copper layer) is formed, an average thickness of the polymer film according to the embodiment of the present disclosure is preferably 6 μm to 500 μm, more preferably 6 μm to 100 μm, and particularly preferably 12 μm to 100 μm.

The average thickness of the polymer film is measured at optional five sites using an adhesive film thickness meter, for example, an electronic micrometer (product name, "KG3001A", manufactured by Anritsu Corporation), and the average value of the measured values is defined as the average thickness of the polymer film.

<Method of Manufacturing Polymer Film>
[Film Formation]

A method of manufacturing the polymer film according to the embodiment of the present disclosure is not particularly limited, and a known method can be referred to.

Suitable examples of the method of manufacturing the polymer film according to the embodiment of the present disclosure include a co-casting method, a multilayer coating method, and a co-extrusion method. Among these, the co-casting method is particularly preferable for formation of a relatively thin film, and the co-extrusion method is particularly preferable for formation of a thick film.

In a case where the film is manufactured by the co-casting method or the multilayer coating method, it is preferable that the co-casting method or the multilayer coating method is performed by using a composition for forming the layer A, a composition for forming the layer B, a composition for forming the layer C, or the like obtained by dissolving or dispersing components of each layer, such as the above-described polymer such as the liquid crystal polymer, in a solvent.

Examples of the solvent include halogenated hydrocarbons such as dichloromethane, chloroform, 1,1-dichloroethane, 1,2-dichloroethane, 1,1,2,2-tetrachloroethane, 1-chlorobutane, chlorobenzene, and o-dichlorobenzene; halogenated phenols such as p-chlorophenol, pentachlorophenol, and pentafluorophenol; ethers such as diethyl ether, tetrahydrofuran, and 1,4-dioxane; ketones such as acetone and cyclohexanone; esters such as ethyl acetate and γ-butyrolactone; carbonates such as ethylene carbonate and propylene carbonate; amines such as triethylamine; nitrogen-containing heterocyclic aromatic compounds such as pyridine; nitriles such as acetonitrile and succinonitrile; amides such as N,N-dimethylformamide, N,N-dimethylacetamide, and N-methylpyrrolidone; urea compounds such as tetramethylurea; nitro compounds such as nitromethane and nitrobenzene; sulfur compounds such as dimethyl sulfoxide and sulfolane; and phosphorus compounds such as hexamethylphosphoramide and tri-n-butyl phosphate. Among these, two or more kinds thereof may be used in combination.

The solvent preferably contains an aprotic compound (particularly, an aprotic compound having no halogen atom) for low corrosiveness and easiness to handle. A proportion of the aprotic compound to the whole solvent is preferably 50% by mass to 100% by mass, more preferably 70% by mass to 100% by mass, and particularly preferably 90% by mass to 100% by mass. In addition, from the viewpoint of easily dissolving the liquid crystal polymer, as the above-described aprotic compound, it is preferable to contain an amide such as N,N-dimethylformamide, N,N-dimethylacetamide, tetramethylurea, and N-methylpyrrolidone, or an ester such as γ-butyrolactone; and it is more preferable to contain N,N-dimethylformamide, N,N-dimethylacetamide, or N-methylpyrrolidone.

In addition, as the solvent, it is preferable to contain a compound having a dipole moment of 3 to 5, because the above-described polymer such as the liquid crystal polymer can be easily dissolved. A proportion of the compound having a dipole moment of 3 to 5 to the whole solvent is preferably 50% by mass to 100% by mass, more preferably 70% by mass to 100% by mass, and particularly preferably 90% by mass to 100% by mass.

It is preferable to use the compound having a dipole moment of 3 to 5 as the above-described aprotic compound.

In addition, as the solvent, it is preferable to contain a compound having a boiling point of 220° C. or lower at 1 atm, because the solvent is easily removed. A proportion of the compound having a boiling point of 220° C. or lower at 1 atm to the whole solvent is preferably 50% by mass to 100% by mass, more preferably 70% by mass to 100% by mass, and particularly preferably 90% by mass to 100% by mass.

It is preferable to use the compound having a boiling point of 220° C. or lower at 1 atm as the above-described aprotic compound.

In addition, in a case where the polymer film is manufactured by the co-casting method, the multilayer coating method, the co-extrusion method, or the like, a support may be used in the method of manufacturing the polymer film according to the embodiment of the present disclosure. In addition, in a case where the metal layer (metal foil) or the like used in the laminate described later is used as the support, the support may be used as it is without being peeled off.

Examples of the support include a metal drum, a metal band, a glass plate, a resin film, and a metal foil. Among these, a metal drum, a metal band, or a resin film is preferable.

Examples of the resin film include a polyimide (PI) film, and examples of commercially available products thereof include U-PILEX S and U-PILEX R (manufactured by Ube Corporation), KAPTON (manufactured by Du Pont-Toray Co., Ltd.), and IF30, IF70, and LV300 (manufactured by SKC Kolon PI, Inc.).

In addition, the support may have a surface treatment layer formed on the surface so that the support can be easily peeled off. Hard chrome plating, a fluororesin, or the like can be used as the surface treatment layer.

An average thickness of the support is not particularly limited, but is preferably 25 μm or more and 75 μm or less and more preferably 50 μm or more and 75 μm or less.

In addition, a method for removing at least a part of the solvent from a cast or applied film-like composition (a casting film or a coating film) is not particularly limited, and a known drying method can be used.

[Stretching]

In the polymer film according to the embodiment of the present disclosure, stretching can be combined as appropriate from the viewpoint of controlling molecular alignment and adjusting linear expansion coefficient and mechanical properties. The stretching method is not particularly limited, and a known method can be referred to, and the stretching method may be carried out in a solvent-containing state or in a dry film state. The stretching in the solvent-containing state may be carried out by gripping and stretching the film, by utilizing a self-contractile force of a web due to drying without stretching the film, or by combining these methods. The stretching is particularly effective for the purpose of improving the breaking elongation and the breaking strength, in a case where brittleness of the film is reduced by addition of an inorganic filler or the like.

[Heat Treatment]

The method of manufacturing the polymer film according to the embodiment of the present disclosure preferably includes a step of heat-treating (annealing) the polymer film.

Specifically, from the viewpoint of dielectric loss tangent and peel strength, the heat treatment temperature in the above-described step of heat-treating is preferably 260° C. to 370° C., more preferably 280° C. to 360° C., and still more preferably 300° C. to 350° C. The heat treatment time is preferably 15 minutes to 10 hours and more preferably 30 minutes to 5 hours.

In addition, the method of manufacturing the polymer film according to the embodiment of the present disclosure may include other known steps as necessary.

<Applications>

The polymer film according to the embodiment of the present disclosure can be used for various applications. Among the various applications, the polymer film can be used suitably as a film for an electronic component such as a printed wiring board and more suitably for a flexible printed circuit board.

In addition, the polymer film according to the embodiment of the present disclosure can be suitably used as a polymer film for metal adhesion.

(Laminate)

The laminate according to the embodiment of the present disclosure may be one in which the polymer film according to the embodiment of the present disclosure is laminated, but it is preferable to include the polymer film according to the embodiment of the present disclosure and a metal layer disposed on a surface of the above-described layer B side of the polymer film, and it is more preferable that the metal layer is a copper layer.

The metal layer disposed on the surface of the above-described layer B side is preferably a metal layer disposed on the surface of the above-described layer B.

In addition, it is preferable that the laminate according to the embodiment of the present disclosure includes the polymer film according to the embodiment of the present disclosure in which the layer B, the layer A, and the layer C are provided in this order, a metal layer disposed on a surface of the above-described layer B side of the polymer film, and a metal layer disposed on a surface of the above-described layer C side of the polymer film; and it is more preferable that both of the metal layers are copper layers.

It is preferable that the metal layer disposed on the surface of the above-described layer C side is a metal layer disposed on the surface of the above-described layer C, and it is more preferable that the metal layer disposed on the surface of the above-described layer B side is a metal layer disposed on the surface of the above-described layer B, and the metal layer disposed on the surface of the above-described layer C side is a metal layer disposed on the surface of the above-described layer C.

In addition, the metal layer disposed on the surface of the above-described layer B side and the metal layer disposed on the surface of the above-described layer C side may be a metal layer having the same material, thickness, and shape, or may be metal layers having different materials, thicknesses, and shapes. From the viewpoint of adjusting the characteristic impedance, the metal layer disposed on the surface of the above-described layer B side and the metal layer disposed on the surface of the above-described layer C side may be metal layers having different materials or thicknesses, or a metal layer may be laminated on only one side of the layer B or the layer C.

Furthermore, from the viewpoint of adjusting the characteristic impedance, preferred examples thereof also include an aspect in which a metal layer is laminated on one side of the layer B or the layer C, and another polymer film (preferably, another liquid crystal polymer film) is laminated on the other side.

In a case where the above-described metal layer disposed on the surface of the above-described layer B side is a copper layer disposed on the surface of the above-described layer B, a peel strength between the above-described layer B and the copper layer is preferably 0.5 kN/m or more, more preferably 0.7 kN/m or more, still more preferably 0.7 kN/m to 2.0 kN/m, and particularly preferably 0.9 kN/m to 1.5 kN/m.

In addition, in a case where the above-described metal layer disposed on the surface of the above-described layer C side is a copper layer disposed on the surface of the above-described layer C, a peel strength between the above-described layer C and the copper layer is preferably 0.5 kN/m or more, more preferably 0.7 kN/m or more, still more preferably 0.7 kN/m to 2.0 kN/m, and particularly preferably 0.9 kN/m to 1.5 kN/m.

In a case of not including the layer C, a surface roughness Rz of the above-described metal layer on the side in contact with the above-described polymer film is preferably 1 μm to 10 μm, more preferably 1 μm to 5 μm, and particularly preferably 1.5 μm to 3 μm. In addition, in a case of including the layer C, from the viewpoint of reducing transmission loss of high-frequency signal, the surface roughness Rz of the above-described metal layer on the side in contact with the above-described polymer film is preferably less than 2.0 μm and particularly preferably 1.8 μm or less.

Since it is preferable that the surface roughness Rz of the above-described metal layer is as small as possible, the lower limit value thereof is not particularly set, but may be, for example, 0 or more.

The "surface roughness Rz" in the present disclosure refers to a value expressed in micrometer, which is the total value of the maximum value of height of peak and the maximum value of depth of valley observed on a roughness curve over the reference length.

In the present disclosure, the surface roughness Rz of the metal layer (for example, the copper layer) is measured by the following method.

Using a noncontact surface/layer cross-sectional shape measurement system VertScan (manufactured by MITSUBISHI CHEMICAL SYSTEMS, Inc.), a square of 465.48 μm in length and 620.64 μm in width is measured to create a roughness curve on the surface of the measurement object (metal layer) and create an average line of the roughness curve. A portion corresponding to the reference length is extracted from the roughness curve. The surface roughness Rz of the measurement object is measured by obtaining the total value of the maximum value of height of peak (that is, height from the average line to summit) and the maximum value of depth of valley (that is, height from the average line to valley bottom) observed in the extracted roughness curve.

In the present disclosure, the peel strength between the layer B or layer C of the polymer film and the metal layer (for example, the copper layer) is measured by the following method.

A peeling test piece with a width of 10 mm is produced from the laminate of the polymer film and the metal layer, the polymer film is fixed to a flat plate with double-sided adhesive tape, and the strength (kN/m) in a case of peeling the metal layer off from the liquid crystal polymer film at 25° C. and a rate of 50 mm/min is measured by the 180° method in conformity with JIS C 5016 (1994).

The metal layer is preferably a copper layer. As the copper layer, a rolled copper foil formed by a rolling method or an electrolytic copper foil formed by an electrolytic method is preferable.

An average thickness of the metal layer (preferably the copper layer) is not particularly limited, but is preferably 2 μm to 20 μm, more preferably 3 μm to 18 μm, and still more preferably 5 μm to 12 μm. The metal layer may be a metal layer with a carrier formed on a support (carrier) so as to be peelable. As the carrier, a known carrier can be used. An average thickness of the carrier is not particularly limited, but is preferably 10 μm to 100 μm and more preferably 18 μm to 50 μm.

The metal layer in the laminate according to the embodiment of the present disclosure may be a metal layer having a circuit pattern.

It is also preferable that the metal layer in the laminate according to the embodiment of the present disclosure is processed into, for example, a desired circuit pattern by etching to form a flexible printed circuit board. The etching method is not particularly limited, and a known etching method can be used.

EXAMPLES

Hereinafter, the present disclosure will be described in more detail with reference to examples. The materials, the used amounts, the proportions, the treatment contents, the treatment procedures, and the like described in the following examples can be appropriately changed without departing from the gist of the present disclosure. Therefore, the scope of the present disclosure is not limited to the following specific examples.

<<Measurement Method>>

[Linear Expansion Coefficient]

A tensile load of 1 g was applied to both ends of a polymer film having a width of 5 mm and a length of 20 mm, and a linear expansion coefficient was calculated from the inclination of TMA curve between 30° C. and 150° C. using a thermomechanical analyzer (TMA) in a case where the temperature is raised from 25° C. to 200° C. at a rate of 5° C./min, lowered to 30° C. at a rate of 20° C./min, and raised again at a rate of 5° C./min.

In a case where the polymer film was a laminate with a copper foil, the copper foil was etched with iron chloride, and the measurement was performed using a film taken out.

[Dielectric Loss Tangent]

A dielectric constant was measured by a resonance perturbation method at a frequency of 10 GHz. A 10 GHz cavity resonator (CP531 manufactured by Kanto Electronics Application & Development Inc.) was connected to a network analyzer ("E8363B" manufactured by Agilent Technology), and a sample (width: 2 mm×length: 80 mm) was inserted into the cavity resonator, and the dielectric constant and dielectric loss tangent of the sample were measured based on a change in resonance frequency for 96 hours before and after the insertion in an environment of a temperature of 25° C. and a humidity of 60% RH.

[Peel Strength]

A peeling test piece with a width of 10 mm was produced from the laminate of the polymer film and the copper layer, the polymer film was fixed to a flat plate with double-sided adhesive tape, and the strength (kN/m) in a case of peeling the polymer film off from the copper layer at a temperature of 25° C. and a rate of 50 mm/min was measured by the 180° method in conformity with JIS C 5016 (1994).

Production Example

<Liquid Crystal Polymer>

LC-A: Liquid crystal polymer produced by production method described below

—Production of LC-A—

940.9 g (5.0 mol) of 6-hydroxy-2-naphthoic acid, 377.9 g (2.5 mol) of 4-hydroxyacetaminophen, 415.3 g (2.5 mol) of isophthalic acid, and 867.8 g (8.4 mol) of acetic acid anhydride were added to a reactor provided with a stirrer, a torque meter, a nitrogen gas introduction pipe, a thermometer, and a reflux condenser, the gas inside the reactor was replaced with nitrogen gas, and the mixture was heated from room temperature (23° C.) to 140° C. over 60 minutes while being stirred in a nitrogen gas stream and was refluxed at 140° C. for 3 hours.

Thereafter, the mixture was heated from 150° C. to 300° C. over 5 hours while distilling off by-product acetic acid and unreacted acetic acid anhydride and maintained at 300° C. for 30 minutes, and the resultant was taken out from the reactor and cooled to room temperature. The obtained solid matter was crushed with a crusher, thereby obtaining powdery liquid crystal polyester (B1). The flow start temperature of the liquid crystal polyester (B1) was 193.3° C.

The liquid crystal polyester (B1) obtained above was heated from room temperature to 160° C. over 2 hours and 20 minutes in a nitrogen atmosphere, further heated from 160° C. to 180° C. over 3 hours and 20 minutes, maintained at 180° C. for 5 hours to carry out solid phase polymerization, cooled, and crushed with a crusher, thereby obtaining powdery liquid crystal polyester (B2). The flow start temperature of the liquid crystal polyester (B2) was 220° C.

The liquid crystal polyester (B2) obtained above was heated from room temperature (23° C.) to 180° C. over 1 hour and 25 minutes in a nitrogen atmosphere, further heated from 180° C. to 255° C. over 6 hours and 40 minutes, maintained at 255° C. for 5 hours to carry out solid phase polymerization, and cooled, thereby obtaining powdery liquid crystal polyester (LC-A). A flow start temperature of LC-A was 302° C. In addition, as a result of measuring a melting point of the LC-A using a differential scanning calorimetry device, the measured value was 311° C.

LC-B: Liquid crystal polymer produced by production method described below

—Production of LC-B—

940.9 g (5.0 mol) of 6-hydroxy-2-naphthoic acid, 377.9 g (2.5 mol) of 4-hydroxyacetaminophen, 415.3 g (2.5 mol) of isophthalic acid, and 867.8 g (8.4 mol) of acetic acid anhydride were added to a reactor provided with a stirrer, a torque meter, a nitrogen gas introduction pipe, a thermometer, and a reflux condenser, the gas inside the reactor was replaced with nitrogen gas, and the mixture was heated from room temperature (23° C.) to 143° C. over 60 minutes while being stirred in a nitrogen gas stream and was refluxed at 143° C. for 1 hour.

Thereafter, the mixture was heated from 150° C. to 300° C. over 5 hours while distilling off by-product acetic acid and unreacted acetic acid anhydride and maintained at 300° C. for 30 minutes, and the resultant was taken out from the reactor and cooled to room temperature. The obtained solid matter was crushed with a crusher, thereby obtaining powdery liquid crystal polyester (B1). A flow start temperature of the liquid crystal polyester (B1) was 191° C.

The liquid crystal polyester (B1) obtained above was heated from room temperature to 160° C. over 2 hours and 20 minutes in a nitrogen atmosphere, further heated from 160° C. to 180° C. over 3 hours and 20 minutes, maintained at 180° C. for 5 hours to carry out solid phase polymerization, cooled, and crushed with a crusher, thereby obtaining powdery liquid crystal polyester (B2). The flow start temperature of the liquid crystal polyester (B2) was 220° C.

The liquid crystal polyester (B2) obtained above was heated from room temperature (23° C.) to 180° C. over 1 hour and 20 minutes in a nitrogen atmosphere, further heated from 180° C. to 240° C. over 5 hours, maintained at 240° C. for 5 hours to carry out solid phase polymerization, and cooled, thereby obtaining powdery liquid crystal polyester (B) (LC-B). A flow start temperature of the liquid crystal polyester (B) was 285° C.

LC-C: Liquid crystal polymer produced by production method described below

—Production of LC-C—

941 g (5.0 mol) of 6-hydroxy-2-naphthoic acid, 273 g (2.5 mol) of 4-aminophenol, 415 g (2.5 mol) of isophthalic acid, and 1123 g (11 mol) of acetic acid anhydride were added to a reactor provided with a stirrer, a torque meter, a nitrogen gas introduction pipe, a thermometer, and a reflux condenser, the gas inside the reactor was replaced with nitrogen gas, and the mixture was heated from room temperature (23° C.) to 150° C. over 15 minutes while being stirred in a nitrogen gas stream and was refluxed at 150° C. for 3 hours.

Thereafter, the mixture was heated from 150° C. to 320° C. over 3 hours while distilling off by-product acetic acid and unreacted acetic acid anhydride and maintained until an increase in viscosity was observed, and the resultant was taken out from the reactor and cooled to room temperature. The obtained solid matter was crushed with a crusher, thereby obtaining powdery liquid crystal polyester (C1).

The liquid crystal polyester (C1) obtained above was maintained at 250° C. for 3 hours in a nitrogen atmosphere to carry out solid phase polymerization, cooled, and crushed with a crusher, thereby obtaining powdery liquid crystal polyester (LC-C).

LC-D: Liquid crystal polymer particles produced by production method described below —Production of LC-D—

1034.99 g (5.5 mol) of 2-hydroxy-6-naphthoic acid, 378.33 g (1.75 mol) of 2,6-naphthalenedicarboxylic acid, 83.07 g (0.5 mol) of terephthalic acid, 272.52 g (2.475 mol; 0.225 mol excess with respect to the total molar amount of 2,6-naphthalenedicarboxylic acid and terephthalic acid) of hydroquinone, 1226.87 g (12 mol) of acetic acid anhydride, and 0.17 g of 1-methylimidazole as a catalyst were added to a reactor provided with a stirrer, a torque meter, a nitrogen gas introduction pipe, a thermometer, and a reflux condenser. After the gas in the reactor was replaced with nitrogen gas, the mixture was heated from room temperature to 145° C. over 15 minutes while being stirred in a nitrogen gas stream and was refluxed at 145° C. for 1 hour.

Next, the mixture was heated from 145° C. to 310° C. over 3 hours 30 minutes while distilling off by-product acetic acid and unreacted acetic acid anhydride and maintained at 310° C. for 3 hours, and solid liquid crystal polyester (D1) was taken out and cooled to room temperature. A flow start temperature of the polyester (D1) was 265° C.

Using a jet mill ("KJ-200" manufactured by KURIMOTO Ltd.), the liquid crystal polyester (D1) was crushed to obtain liquid crystal polyester particles (LC-D). An average particle diameter of the liquid crystal polyester particles was 9 μm.

P-1: Mixture of pellets of commercially available polyphenylene ether (SA120, manufactured by SABIC; weight-average molecular weight Mw: 2,600)/bisphenol A-type epoxy resin (EPICLON 850S, manufactured by DIC Corporation; average number of epoxy groups: 2)/bisphenol A-type cyanate ester resin (Badcy, manufactured by LONZA KK.)/aromatic condensed phosphate ester (PX-200, manufactured by DAIHACHI CHEMICAL INDUSTRY CO., LTD.)/tris(diethylphosphinyloxy) aluminum (EXOLIT OP-935, manufactured by CLARIANT Japan)/zinc octoate=25/34/25/8/8/0.01 (mass ratio)

<Additive>

M-1: Commercially available aminophenol-type epoxy resin (jER630LSD, manufactured by Mitsubishi Chemical Corporation.) was used so that the amount of solid content was the amount shown in Table 1.

M-2: Commercially available thermosetting resin (SLK containing mainly a polymer-type curable compound, manufactured by Shin-Etsu Chemical Co., Ltd.) was used so that the amount of solid content was the amount shown in Table 1.

A-1: Commercially available hydrophobic silica sol having an average particle diameter of 45 nm (MEK-ST-L, solid content: 30% by mass, methyl ethyl ketone (MEK) solvent, manufactured by Nissan Chemical Industries Ltd.) was used so that the amount of solid content components was the amount shown in Table 1.

A-2: Commercially available silica particles having an average particle diameter of 0.5 μm (SO-C2, manufactured by Admatechs) were used so that the amount of solid content was the amount shown in Table 1.

A-3: Solvent of commercially available polytetrafluoroethylene (PTFE) particles (Polyflon PTFE D-210C, average particle diameter: 0.25 μm, manufactured by DAIKIN INDUSTRIES, LTD.) was replaced with an N-methylpyrrolidone solvent, and used so that the solid content in the polymer film was the amount shown in Table 1.

A-4: Copolymer particles of ethylene tetrafluoride and perfluoroalkoxy ethylene (PFA) (melting point: 280° C., average particle diameter: 0.2 μm to 0.5 μm, dielectric loss tangent: 0.001)

A-5: Commercially available hollow powder having an average particle diameter of 16 μm (glass bubbles iM30K, manufactured by 3M Japan Limited)

A-6: Boron nitride particles (melting point >500° C., HP40MF100 (manufactured by Mizushima Ferroalloy Co., Ltd.), dielectric loss tangent: 0.0007)

B-1: Commercially available ultrahigh-molecular-weight polyethylene particles having an average particle diameter of 10 μm (Mipelon PM200, manufactured by Mitsui Chemicals, Inc.) were used so that the amount of solid content was the amount shown in Table 1.

Examples 1 to 22 and Comparative Examples 1 and 2

<Film Formation>

The method shown in Table 1 was selected from among the following co-castings A to C, multilayer coating A or B, and co-extrusion.

[Co-Casting a (Solution Film Formation)]

—Preparation of Polymer Solution—

The polymer shown in Table 1 and the additive shown in Table 1 were added to N-methylpyrrolidone, and the mixture was stirred at 140° C. for 4 hours in a nitrogen atmosphere, thereby obtaining a polymer solution. The above-described polymer and additive were added in the volume ratios shown in Table 1, and the concentration of solid contents was set to the values shown in Table 1.

Subsequently, first, the polymer solution was allowed to pass through a sintered fiber metal filter having a nominal pore diameter of 10 μm and allowed to pass through a sintered fiber metal filter having the same nominal pore diameter of 10 μm, thereby obtaining each polymer solution for the layer A and the layer B, and an optional polymer solution for the layer C.

In a case where the additive was not dissolved in N-methylpyrrolidone, a liquid crystal polymer solution was prepared without adding the additive, the mixture was allowed to pass through the above-described sintered fiber metal filter, and then the additive was added thereto and stirred.

—Production of Film—

The obtained polymer solutions for the layer A and the layer B and optional polymer solution for the layer C were fed to a casting die equipped with a feedblock adapted for co-casting, and cast onto a roughened surface of a copper foil (manufactured by MITSUI MINING & SMELTING CO., LTD., 3EC-M1S-HTE, thickness: 12 μm, surface roughness: 1.8 μm) as a support, thereby producing each laminate of layer B/layer A(/layer C)/copper foil. The casting film was dried at 40° C. for 4 hours to remove the solvent from the casting film. Thereafter, the temperature was raised from room temperature (25° C.) to 270° C. at 1° C./min under a nitrogen atmosphere, and a heat treatment was performed at the temperature for 2 hours to obtain each polymer film (laminate) having a copper layer.

[Co-Casting B (Solution Film Formation)]

In the above-described co-casting A, casting was carried out by changing the support from the copper foil to a stainless steel belt. In a moment when the amount of residual solvent reached 25% by mass, the laminate of layer B/layer A(/layer C) was peeled off from the support, and the web (laminate) was transported while applying 5% draw to the web (laminate). Thereafter, both ends of the laminate were gripped with tenter clips, and the solvent was removed while the laminate was stretched by 8% in the width direction. Here, the "(/layer C) refers to that, in a case of including the layer C, a laminate of layer B/layer A/layer C was produced. Further, heat treatment was performed in the same manner as in the co-casting A described above to obtain a polymer film.

[Co-Casting C (Solution Film Formation)]

A polymer film (laminate) having a copper layer was obtained in the same manner as co-casting A, except that, in the above-described co-casting A, the support was changed to a copper foil (manufactured by FUKUDA METAL FOIL & POWER CO., LTD., CF-T9DA-SV-18, thickness: 18 μm, surface roughness Rz of a treated surface: 0.85 μm), and the cast was performed on the treated surface side of the copper foil.

[Multilayer Coating A]
—Preparation of Polymer Solution—

The polymer shown in Table 1 and the additive shown in Table 1 were added to N-methylpyrrolidone, and the mixture was stirred at 140° C. for 4 hours in a nitrogen atmosphere, thereby obtaining a polymer solution. The above-described polymer and additive were added in the volume ratios shown in Table 1, and the concentration of solid contents was set to the values shown in Table 1.

Subsequently, first, the polymer solution was allowed to pass through a sintered fiber metal filter having a nominal pore diameter of 5 μm and allowed to pass through a sintered fiber metal filter having the same nominal pore diameter of 5 μm, thereby obtaining each polymer solution for the layer A and the layer B.

In a case where the additive was not dissolved in N-methylpyrrolidone, a liquid crystal polymer solution was prepared without adding the additive, the mixture was allowed to pass through the above-described sintered fiber metal filter, and then the additive was added thereto and stirred.

—Production of Film—

The obtained polymer solutions for the layer A and the layer B were fed to a slot die coater equipped with a slide coater, and applied onto a roughened surface of a copper foil (manufactured by MITSUI MINING & SMELTING CO., LTD., 3EC-M2S-VLP, thickness: 18 μm, surface roughness Rz of a roughened surface: 1.8 μm) for multilayer coating. The coating film was dried at 40° C. for 4 hours to remove the solvent from the coating film. Thereafter, the temperature was raised from room temperature to 270° C. at 1° C./min under a nitrogen atmosphere, and a heat treatment was performed at the temperature for 2 hours to obtain a polymer film (laminate) having a copper layer.

[Multilayer Coating B]
—Preparation of Polymer Solution—

The polymer shown in Table 1 and the additives shown in Table 1 were added to toluene such that the concentration of solid contents was the value of Table 1, and the mixture was stirred for 60 minutes to obtain polymer solutions for the layer A and the layer B, respectively.

—Production of Film—

The polymer solutions for the layer A and the layer B were fed to a slot die coater equipped with a slide coater, and applied onto a treated surface of a copper foil (manufactured by FUKUDA METAL FOIL & POWER CO., LTD., CF-T9DA-SV-18, thickness: 18 μm, surface roughness Rz of a treated surface: 0.85 μm) for multilayer coating. After drying at 100° C. for 3 minutes, the coating film was dried at 170° C. for 3 minutes to remove the solvent from the coating film. Thereafter, the temperature was raised from room temperature to 200° C. at 1° C./min, and a heat treatment was performed at the temperature for 2 hours to obtain a polymer film (laminate) having a copper layer.

[Co-Extrusion (Melt Film Formation)]
—Production of Resin Pellets—

Powder of the above-described polymer and the additive were mixed with each other, the MEK solvent contained in the filler A-1 was removed in a nitrogen flow atmosphere at 80° C., and then the resultant was pelletized in a nitrogen atmosphere using a biaxial extruder. The obtained pellets for the layer A and pellets for the layer B were dried with dry air at 80° C. and used.

—Production of Film—

The obtained pellets were supplied into a cylinder through the same supply port of the biaxial extruder having a screw diameter of 50 mm, and heated and kneaded at 340° C. to 350° C. to obtain a kneaded material. Subsequently, the kneaded material for the layer A and the kneaded material for the layer B were respectively fed to a T-die having a multi-manifold structure, and a film-like kneaded material in a molten state was discharged and solidified on a chill roll. The obtained film was stripped from the chill roll, and stretched by tenter to adjust anisotropy (MD/TD) of elastic modulus to 2 or less, thereby obtaining a polymer film.

[Production of Polymer Film Having Copper Layer]

Among the above-described polymer films, with regard to the polymer film produced by the co-casting B or the co-extrusion and not formed on the copper foil, a copper layer was laminated by the following procedure.

The obtained polymer film was placed on a copper foil (manufactured by MITSUI MINING & SMELTING CO., LTD., 3EC-M1S-HTE, 12 μm) such that the layer B side was in contact with a roughened surface of the copper foil, and using a laminator ("Vacuum laminator V-130" manufactured by Nikko-Materials Co., Ltd.), lamination was performed for 1 minute under conditions of 140° C. and a laminating pressure of 0.4 MPa. Subsequently, using a thermocompression machine ("MP-SNL" manufactured by Toyo Seiki Seisaku-sho, Ltd.), thermocompression was performed under conditions of 300° C. and 4.5 MPa for 10 minutes to obtain a polymer film (laminate) having a copper layer.

<<Evaluation>>

Each of the produced polymer films was evaluated by the measurement methods described above, and the evaluation results are shown in Table 1. Except for the measurement of the peel strength, the evaluation was performed in a state in which the copper layer had been peeled off from the polymer film having a copper layer.

In addition, for each of the produced polymer films, a resin film was laminated instead of the copper layer, and the peel strength was measured.

| | Layer B (surface layer) | | | | | Layer A (core layer) | | | | | |
|---|---|---|---|---|---|---|---|---|---|---|---|
| | Polymer | | Additive | | Concentration of solid | Average | Polymer | | Additive | | Concentration of solid | Dielectric | Average |
| | Type | Content (% by volume) | Type | Content (% by volume) | content (% by mass) | thickness | Type | Content (% by volume) | Type | Content (% by volume) | content (% by mass) | loss tangent | thickness |
| Example 1 | LC-A | 100 | — | 0 | 20 | 5 μm | LC-A | 50 | A-1 | 50 | 23 | 0.002 | 40 μm |
| Example 2 | LC-A | 100 | — | 0 | 20 | 5 μm | LC-A | 50 | A-1 | 50 | 23 | 0.002 | 45 μm |
| Example 3 | LC-A | 100 | — | 0 | 20 | 5 μm | LC-A | 50 | A-1 | 50 | 23 | 0.002 | 45 μm |
| Example 4 | LC-A | 100 | — | 0 | 20 | 5 μm | LC-A | 50 | A-1 | 50 | 23 | 0 002 | 20 μm |
| Example 5 | LC-A | 100 | — | 0 | 10 | 5 μm | LC-A | 50 | A-1 | 50 | 7 | 0.002 | 45 μm |
| Example 6 | LC-A | 100 | — | 0 | 20 | 5 μm | LC-A | 50 | A-1 | 50 | 23 | 0.002 | 35 μm |

-continued

| | Polymer | | Additive | | Concentration of solid content (% by mass) | Average thickness | Polymer | Content (% by volume) | Additive Type | Content (% by volume) | Concentration of solid content (% by mass) | Average thickness |
|---|---|---|---|---|---|---|---|---|---|---|---|---|
| Comparative Example 1 | — | — | — | — | — | — | LC-A | 50 | A-1 | 50 | 23 | 0.002 | 50 μm |
| Comparative Example 2 | LC-A | 100 | — | 0 | 20 | 5 μm | LC-A | 100 | — | 0 | 23 | 0.005 | 50 μm |
| Example 7 | LC-B | 100 | — | 0 | 8 | 2 μm | LC-B | 50 | A-2 | 50 | 15 | 0.002 | 42 μm |
| Example 8 | LC-B | 100 | — | 0 | 8 | 5 μm | LC-B | 50 | A-2 | 50 | 15 | 0.002 | 42 μm |
| Example 9 | LC-B | 100 | — | 0 | 8 | 5 μm | LC-B | 50 | | | 50 | 15 | 0.002 | 42 μm |
| Example 10 | LC-A | 100 | — | 0 | 8 | 5 μm | LC-B | 50 | A-2 | 50 | 15 | 0.002 | 42 μm |
| Example 11 | LC-B | 100 | — | 0 | 8 | 10 μm | LC-B | 50 | A-2 | 50 | 15 | 0.002 | 42 μm |
| Example 12 | LC-B | 20 | B-1 | 80 | 30 | 20 μm | LC-B | 50 | A-2 | 50 | 15 | 0.002 | 42 μm |
| Example 13 | LC-B | 20 | B-1 | 80 | 30 | 35 μm | LC-B | 50 | A-2 | 50 | 15 | 0.002 | 42 μm |
| Example 14 | LC-B | 100 | — | 0 | 8 | 5 μm | LC-B | 25 | A-2 | 75 | 26 | 0.001 | 42 μm |
| Example 15 | LC-B | 100 | — | 0 | 8 | 5 μm | LC-B | 80 | LC-D | 20 | 10 | 0.004 | 42 μm |
| Example 16 | LC-B | 100 | — | 0 | 8 | 5 μm | LC-B | 75 | LC-D | 25 | 10 | 0.004 | 42 μm |
| Example 17 | LC-B | 100 | — | 0 | 8 | 5 μm | LC-B | 50 | A-3 | 50 | 15 | 0.002 | 42 μm |
| Example 18 | LC-B | 100 | — | 0 | 8 | 5 μm | LC-B | 50 | A-4 | 50 | 15 | 0.002 | 42 μm |
| Example 19 | LC-B | 100 | — | 0 | 8 | 5 μm | LC-B | 50 | A-5 | 30 | 15 | 0.002 | 42 μm |
| Example 20 | LC-B | 100 | — | 0 | 8 | 5 μm | LC-B | 50 | A-6 | 50 | 15 | 0.002 | 42 μm |
| Example 21 | LC-C | 100 | — | 0 | 8 | 5 μm | LC-C | 50 | A-2 | 50 | 15 | 0.002 | 42 μm |
| Example 22 | P-1 | 100 | — | 0 | 60 | 10 μm | P-1 | 50 | A-2 | 50 | 80 | 0.004 | 35 μm |

| | Layer C (surface layer) | | | | | | | Evaluation result | | |
| | Polymer | | Additive | | Concentration of solid content (% by mass) | Average thickness | Film formation method | Polymer film | | |
| | Type | Content (% by volume) | Type | Content (% by volume) | | | | Linear expansion coefficient | Dielectric loss tangent | Laminate Peel strength |
|---|---|---|---|---|---|---|---|---|---|---|
| Example 1 | LC-A | 100 | — | 0 | 20 | 5 μm | Co-casting A | 22 ppm/K | 0.002 | 1.0 kN/m |
| Example 2 | — | — | — | — | — | — | Co-casting A | 21 ppm/K | 0.002 | 1.0 kN/m |
| Example 3 | — | — | — | — | — | — | Co-casting B | 17 ppm/K | 0.002 | 1.2 kN/m |
| Example 4 | — | — | — | — | — | — | Co-casting A | 19 ppm/K | 0.002 | 1.0 kN/m |
| Example 5 | — | — | — | — | — | — | Multilayer coating A | 21 ppm/K | 0.002 | 1.0 kN/m |
| Example 6 | — | — | — | — | — | — | Co-extrusion | 15 ppm/K | 0.002 | 0.7 kN/m |
| Comparative Example 1 | — | — | — | — | — | — | Co-casting A | 20 ppm/K | 0.002 | 0.3 kN/m |
| Comparative Example 2 | — | — | — | — | — | — | Co-casting A | 80 ppm/K | 0.002 | 1.0 kN/m |
| Example 7 | LC-B | 95 | M-1 | 5 | 8 | 3 μm | Co-casting C | 22 ppm/K | 0.003 | 0.7 kN/m |
| Example 8 | LC-B | 95 | M-1 | 5 | 8 | 3 μm | Co-casting C | 22 ppm/K | 0.003 | 1.0 kN/m |
| Example 9 | LC-B | 95 | M-2 | 5 | 8 | 3 μm | Co-casting C | 22 ppm/K | 0.002 | 1.0 kN/m |
| Example 10 | LC-A | 95 | M-1 | 5 | 8 | 3 μm | Co-casting C | 22 ppm/K | 0.003 | 1.0 kN/m |
| Example 11 | LC-B | 95 | M-2 | 5 | 8 | 3 μm | Co-casting C | 22 ppm/K | 0.003 | 1.0 kN/m |
| Example 12 | LC-B | 95 | M-1 | 5 | 8 | 3 μm | Co-casting C | 27 ppm/K | 0.002 | 0.8 kN/m |
| Example 13 | LC-B | 95 | M-1 | 5 | 8 | 3 μm | Co-casting C | 32 ppm/K | 0.002 | 0.9 kN/m |
| Example 14 | LC-B | 95 | M-1 | 5 | 8 | 3 μm | Co-casting C | 20 ppm/K | 0.001 | 1.0 kN/m |
| Example 15 | LC-B | 95 | M-1 | 5 | 8 | 3 μm | Co-casting C | 40 ppm/K | 0.004 | 1.0 kN/m |
| Example 16 | LC-B | 95 | M-1 | 5 | 8 | 3 μm | Co-casting C | 47 ppm/K | 0.004 | 1.0 kN/m |
| Example 17 | LC-B | 95 | M-1 | 5 | 8 | 3 μm | Co-casting C | 48 ppm/K | 0.002 | 1.0 kN/m |
| Example 18 | LC-B | 95 | M-1 | 5 | 8 | 3 μm | Co-casting C | 45 ppm/K | 0.002 | 1.0 kN/m |
| Example 19 | LC-B | 95 | M-1 | 5 | 8 | 3 μm | Co-casting C | 22 ppm/K | 0.002 | 1.0 kN/m |
| Example 20 | LC-B | 95 | M-1 | 5 | 8 | 3 μm | Co-casting C | 22 ppm/K | 0.002 | 1.0 kN/m |
| Example 21 | LC-C | 95 | M-1 | 5 | 8 | 3 μm | Co-casting C | 21 ppm/K | 0.003 | 1.0 kN/m |
| Example 22 | P-1 | 90 | M-1 | 10 | 60 | 5 μm | Multilayer coating B | 20 ppm/K | 0.006 | 1.2 kN/m |

From the results shown in Table 1, the polymer films of Examples 1 to 22, which are the polymer film according to the embodiment of the present disclosure, had lower linear expansion coefficient and were excellent in adhesiveness with the metal layer for a substrate than the polymer film of Comparative Example 1 or 2. Since the polymer film according to the embodiment of the present disclosure, which had low linear expansion coefficient, approached a linear expansion coefficient of the copper layer, curl of the laminate was suppressed well.

In addition, the polymer films of Examples 1 to 22, that are the polymer film according to the embodiment of the present disclosure in which the resin film was laminated instead of the copper layer, were excellent in adhesiveness with the resin film than the polymer film of Comparative Example 1 or 2.

What is claimed is:
1. A liquid crystal polymer film comprising:
a layer A;
a layer B on at least one surface of the layer A; and
a layer C, wherein the layer B, the layer A, and the layer C are provided in this order, the liquid crystal polymer film contains a filler in at least one layer of the layer A or the layer B, and a number density of the filler is higher inside the liquid crystal polymer film than on a surface of the liquid crystal polymer film, wherein the layer A contains a liquid crystal polymer, a linear expansion coefficient of the liquid crystal polymer film is −20 ppm/K to 50 ppm/K, and
the liquid crystal polymer has a constitutional unit represented by any of Formulae (2) and (3), —CO—Ar$^2$—CO—      Formula (2)

—X—Ar$^3$—Y—      Formula (3)

in Formulae (2) and (3), Ar$^2$ and Ar$^3$ each independently represent a group represented by Formula (4), X and Y each independently represent an oxygen atom or an imino group, and hydrogen atoms in Ar$^2$ and Ar$^3$ may be each independently substituted with a halogen atom, an alkyl group, or an aryl group —Ar$^4$—Z—Ar$^5$—      Formula (4)

in Formula (4), Ar$^4$ and Ar$^5$ each independently represent a phenylene group or a naphthylene group, and at least one of Ar$^4$ and Ar$^5$ represents a naphthylene group, and Z represents an oxygen atom, a sulfur atom, a carbonyl group, a sulfonyl group, or an alkylene group.

2. The liquid crystal polymer film according to claim 1, wherein a linear expansion coefficient of the layer A is −20 ppm/K to 50 ppm/K.

3. The liquid crystal polymer film according to claim 1, wherein the liquid crystal polymer further has a constitutional unit represented by Formula (1), —O—Ar$^1$—CO—      Formula (1)

in Formula (1), Ar$^1$ represents a phenylene group, a naphthylene group, or a biphenylylene group, and hydrogen atoms in Ar$^1$ may be each independently substituted with a halogen atom, an alkyl group, or an aryl group.

4. The liquid crystal polymer film according to claim 1, wherein a dielectric loss tangent of the liquid crystal polymer film is 0.01 or less.

5. The liquid crystal polymer film according to claim 1, wherein a dielectric loss tangent of the layer A is 0.005 or less.

6. The liquid crystal polymer film according to claim 1, wherein the layer A contains the filler.

7. The liquid crystal polymer film according to claim 1, wherein a dielectric loss tangent of the layer B is 0.02 or less.

8. The liquid crystal polymer film according to claim 1, wherein the layer B contains a liquid crystal polymer.

9. The liquid crystal polymer film according to claim 1, wherein a dielectric loss tangent of the layer C is 0.02 or less.

10. The liquid crystal polymer film according to claim 1, wherein the layer C contains a liquid crystal polymer.

11. The liquid crystal polymer film according to claim 1, wherein the layer C contains a filler.

12. A laminate comprising:
the liquid crystal polymer film according to claim 1; and
a metal layer disposed on a surface of the layer B side in the liquid crystal polymer film.

13. The laminate according to claim 12,
wherein the metal layer is a copper layer disposed on the surface of the layer B, and
a peel strength between the layer B and the copper layer is 0.5 kN/m or more.

14. A laminate comprising:
the liquid crystal polymer film according to claim 1;
a metal layer disposed on a surface of the layer B side in the liquid crystal polymer film; and
a metal layer disposed on a surface of the layer C side in the liquid crystal polymer film.

15. The laminate according to claim 14,
wherein the metal layer disposed on the surface of the layer C side is a copper layer disposed on the surface of the layer C, and
a peel strength between the layer C and the copper layer disposed on the surface of the layer C is 0.5 kN/m or more.

* * * * *